US009960011B2

(12) United States Patent
Lee et al.

(10) Patent No.: US 9,960,011 B2
(45) Date of Patent: May 1, 2018

(54) PLASMA GENERATION APPARATUS AND PLASMA GENERATION METHOD

(71) Applicant: Plasmart Inc., Daejeon (KR)

(72) Inventors: Yong-Gwan Lee, Daejeon (KR);
Jae-Hyun Kim, Daejeon (KR);
Sang-Won Lee, Daejeon (KR);
Sae-Hoon Uhm, Hwaseong-si (KR);
Young-Rok Kim, Daejeon (KR);
Kyu-Hun Lee, Daejeon (KR);
Jin-Joong Kim, Seoul (KR)

(73) Assignee: Plasmart Inc., Daejeon (KR)

(*) Notice: Subject to any disclaimer, the term of this patent is extended or adjusted under 35 U.S.C. 154(b) by 1010 days.

(21) Appl. No.: 14/160,117

(22) Filed: Jan. 21, 2014

(65) Prior Publication Data

US 2014/0130980 A1    May 15, 2014

Related U.S. Application Data

(63) Continuation of application No. PCT/KR2012/005525, filed on Jul. 12, 2012.

(30) Foreign Application Priority Data

Aug. 1, 2011 (KR) .......................... 10-2011-0076585

(51) Int. Cl.
*C23C 16/00* (2006.01)
*C23F 1/00* (2006.01)
(Continued)

(52) U.S. Cl.
CPC .......... *H01J 37/30* (2013.01); *H01J 37/3266* (2013.01); *H01J 37/32192* (2013.01); *H05H 1/46* (2013.01); *H05H 2001/4622* (2013.01)

(58) Field of Classification Search
USPC .......................... 156/345.41, 345.48, 345.49;
118/723 MW, 723 I, 723 IR, 723 AN;
(Continued)

(56) References Cited

U.S. PATENT DOCUMENTS 3,979,624 A     9/1976   Liu et al.
5,061,838 A  *  10/1991  Lane ................. H01J 37/32357
                                                          156/345.42

(Continued)

FOREIGN PATENT DOCUMENTS

CN          1293608 C      1/2007
CN        100567567 C     12/2009
(Continued)

OTHER PUBLICATIONS

Chinese Office Action for Application No. CN 201380008244.8 dated Apr. 5, 2016.
(Continued)

*Primary Examiner* — Rakesh Dhingra
(74) *Attorney, Agent, or Firm* — Jenkins, Wilson, Taylor & Hunt, P.A.

(57) ABSTRACT

Provided are a plasma generation apparatus and a plasma generation method. The plasma generation apparatus includes a chamber including a dielectric window and a toroidal discharge space, a magnetic core disposed to surround a portion of the chamber, an induction coil disposed to wind the magnetic core, and a waveguide radiating a microwave through the dielectric window. Alternating current flowing in the induction coil forms a magnetic flux at the magnetic core, and the magnetic flux generates inductively-coupled plasma. A microwave propagating along the waveguide generates microwave plasma inside the chamber.

15 Claims, 14 Drawing Sheets

(51) Int. Cl.
  *H01L 21/306* (2006.01)
  *H01J 37/30* (2006.01)
  *H01J 37/32* (2006.01)
  *H05H 1/46* (2006.01)

(58) Field of Classification Search
  USPC .................................................. 315/111.51
  See application file for complete search history.

(56) References Cited

U.S. PATENT DOCUMENTS

| | | |
|---|---|---|
| 5,114,770 A | 5/1992 | Echizen |
| 5,227,698 A | 7/1993 | Simpson et al. |
| 5,330,578 A | 7/1994 | Sakama et al. |
| 5,404,076 A | 4/1995 | Dolan et al. |
| 5,479,072 A | 12/1995 | Dakin et al. |
| 5,505,780 A * | 4/1996 | Dalvie .................. C23C 16/511 118/723 I |
| 5,556,649 A | 9/1996 | Bose et al. |
| 5,565,074 A | 10/1996 | Sato et al. |
| 5,594,303 A | 1/1997 | Simpson et al. |
| 5,653,811 A | 8/1997 | Chan |
| 5,688,064 A | 11/1997 | Shanks |
| 5,733,511 A | 3/1998 | De Francesco |
| 5,846,883 A | 12/1998 | Moslehi |
| 6,049,086 A | 4/2000 | Foggiato et al. |
| 6,074,512 A | 6/2000 | Collins et al. |
| 6,189,484 B1 | 2/2001 | Yin |
| 6,259,209 B1 | 7/2001 | Bhardwaj et al. |
| 6,351,075 B1 | 2/2002 | Barankova |
| 6,352,049 B1 | 3/2002 | Yin et al. |
| 6,353,201 B1 | 3/2002 | Yamakoshi |
| 6,451,161 B1 | 9/2002 | Jeng et al. |
| 6,551,447 B1 | 4/2003 | Savas |
| 6,685,798 B1 | 2/2004 | Holland |
| 6,792,889 B2 | 9/2004 | Nakano et al. |
| 6,873,119 B2 | 3/2005 | Kim |
| 7,090,705 B2 | 8/2006 | Miyazaki et al. |
| 7,163,877 B2 | 1/2007 | Niimi et al. |
| 7,183,716 B2 | 2/2007 | Kanarov et al. |
| 7,453,191 B1 | 11/2008 | Song |
| 7,646,608 B2 | 1/2010 | Thompson |
| 7,767,561 B2 | 8/2010 | Hanawa |
| 7,819,081 B2 | 10/2010 | Kawasaki et al. |
| 7,845,310 B2 | 12/2010 | DiVergilio |
| 7,854,213 B2 | 12/2010 | Brcka |
| 7,863,582 B2 | 1/2011 | Godyak |
| 7,886,690 B2 | 2/2011 | Ellingboe |
| 7,952,048 B2 | 5/2011 | Choi et al. |
| 8,018,163 B2 | 9/2011 | Wi |
| 8,128,884 B2 | 3/2012 | Min et al. |
| 8,152,954 B2 | 4/2012 | Bettencourt |
| 8,169,148 B2 | 5/2012 | Jeon et al. |
| 8,444,870 B2 | 5/2013 | Godyak |
| 8,636,871 B2 | 1/2014 | Sawada et al. |
| 8,835,869 B2 | 9/2014 | Yevtukhov |
| 8,900,402 B2 | 12/2014 | Holland et al. |
| 8,992,725 B2 | 3/2015 | Godyak |
| 8,994,270 B2 | 3/2015 | Koo |
| 9,066,413 B2 | 6/2015 | Chang et al. |
| 9,082,590 B2 | 7/2015 | Carducci |
| 9,281,176 B2 | 3/2016 | Kim et al. |
| 2001/0002584 A1 | 6/2001 | Liu |
| 2003/0015965 A1 | 1/2003 | Godyak |
| 2004/0011465 A1* | 1/2004 | Matsumoto ......... H01J 37/3222 156/345.41 |
| 2004/0107908 A1* | 6/2004 | Collins ............. H01J 37/32082 118/723 I |
| 2004/0239261 A1 | 12/2004 | Kim et al. |
| 2004/0261720 A1* | 12/2004 | Tolmachev ........ H01J 37/32211 118/723 MW |
| 2005/0001556 A1 | 1/2005 | Hoffman et al. |
| 2005/0214477 A1* | 9/2005 | Hanawa ................ C23C 16/402 427/569 |
| 2005/0255255 A1 | 11/2005 | Kawamura et al. |
| 2006/0086699 A1* | 4/2006 | Holber .................. H01J 37/321 219/121.54 |
| 2007/0119828 A1 | 5/2007 | Kondo et al. |
| 2007/0193513 A1 | 8/2007 | Deguchi |
| 2007/0254113 A1* | 11/2007 | Hongo ................ C23C 16/4408 427/579 |
| 2008/0050292 A1 | 2/2008 | Godyak |
| 2009/0102385 A1 | 4/2009 | Wi |
| 2009/0233385 A1 | 9/2009 | Okumura et al. |
| 2009/0255630 A1 | 10/2009 | Toyoda et al. |
| 2009/0255639 A1 | 10/2009 | Wang |
| 2010/0006543 A1 | 1/2010 | Sawada et al. |
| 2010/0015357 A1 | 1/2010 | Hanawa et al. |
| 2010/0024729 A1 | 2/2010 | Cao et al. |
| 2010/0095888 A1 | 4/2010 | Mori et al. |
| 2010/0206847 A1* | 8/2010 | Chen ................ H01J 37/32357 216/67 |
| 2012/0031559 A1 | 2/2012 | Dhindsa et al. |
| 2012/0289053 A1 | 11/2012 | Holland et al. |
| 2013/0255575 A1 | 10/2013 | Chang |
| 2014/0077700 A1 | 3/2014 | Chang et al. |
| 2014/0292193 A1 | 10/2014 | Chang |
| 2014/0320016 A1 | 10/2014 | Chang |
| 2014/0360670 A1 | 12/2014 | Chen et al. |
| 2014/0370715 A1 | 12/2014 | Chung |
| 2015/0155155 A1 | 6/2015 | Kim et al. |

FOREIGN PATENT DOCUMENTS

| | | |
|---|---|---|
| CN | 101 800 161 | 8/2010 |
| CN | 101194338 B | 9/2010 |
| CN | 101 805 895 B | 9/2011 |
| CN | 101601125 B | 7/2012 |
| CN | 101534930 B | 2/2013 |
| CN | 101420816 B | 5/2014 |
| EP | 2120514 B1 | 6/2012 |
| JP | 61001024 A | 1/1986 |
| JP | 06-122983 | 5/1994 |
| JP | 06-310436 A | 11/1994 |
| JP | 08-008096 | 1/1996 |
| JP | 09-192479 | 7/1997 |
| JP | 10-284296 A | 10/1998 |
| JP | H11-154600 A | 6/1999 |
| JP | 2000/277506 A | 10/2000 |
| JP | 2000/277599 A | 10/2000 |
| JP | 2002/025919 | 1/2002 |
| JP | 2003/529216 A | 9/2003 |
| JP | 2004/506339 A | 2/2004 |
| JP | 2005/259836 | 9/2005 |
| JP | 2006/516805 A | 7/2006 |
| JP | 2006/310883 A | 11/2006 |
| JP | 2008/519416 A | 6/2008 |
| JP | 2008/181737 A | 8/2008 |
| JP | 2008/282947 A | 11/2008 |
| JP | 2010/132950 | 6/2010 |
| JP | 4601104 B2 | 10/2010 |
| KR | 10-2001/0040736 A | 5/2001 |
| KR | 10-2001/0093439 | 10/2001 |
| KR | 10-2004/0034758 A | 4/2004 |
| KR | 10-2005-0092277 | 9/2005 |
| KR | 10-2005/0110548 A | 11/2005 |
| KR | 10-2007/0062708 | 6/2007 |
| KR | 10-0761687 B1 | 9/2007 |
| KR | 10-2008/0061814 A | 7/2008 |
| KR | 10 2008 0068974 A | 7/2008 |
| KR | 10-2009/0005542 | 1/2009 |
| KR | 10-2009/0125406 A | 7/2009 |
| KR | 10-2009/0108730 | 10/2009 |
| KR | 10-2010/0002290 A | 6/2010 |
| KR | 10-2010/0066994 | 6/2010 |
| KR | 10-2010/0087266 A | 8/2010 |
| KR | 10-2011/0025328 A | 10/2011 |
| KR | 10-1362891 B1 | 2/2014 |
| TW | 399 396 B | 7/2000 |
| TW | 462 207 | 11/2001 |
| TW | 200850082 | 12/2008 |
| WO | WO-92-08240 | 5/1992 |
| WO | WO-93-21655 | 10/1993 |
| WO | WO-94-08439 | 4/1994 |

(56) References Cited

FOREIGN PATENT DOCUMENTS

| WO | WO-95-10848 | 4/1995 |
|----|----|----|
| WO | WO-96-28840 | 9/1996 |
| WO | WO-96-33509 | 10/1996 |
| WO | WO-97-02589 A | 1/1997 |
| WO | WO-97-27609 | 7/1997 |
| WO | WO-98-53474 A2 | 11/1998 |
| WO | WO 2007/002455 A2 | 1/2007 |
| WO | WO-2012/077843 A1 | 6/2012 |
| WO | WO-2012/157844 | 11/2012 |
| WO | WO 2013/018998 | 2/2013 |
| WO | WO-2013/055056 A1 | 4/2013 |
| WO | WO-2014/003333 A1 | 1/2014 |

OTHER PUBLICATIONS

Non-Final Office Action for U.S. Appl. No. 14/251,013 dated May 19, 2016.
Final Office Action for U.S. Appl. No. 14/472,781 dated Aug. 1, 2016.
Advisory Action for U.S. Appl. No. 14/472,781 dated Oct. 21, 2016.
Non-Final Office Action for U.S. Appl. No. 14/472,781 dated Nov. 22, 2016.
Non-Final Office Action for U.S. Appl. No. 14/251,013 dated Dec. 1, 2016.
Interview Summary for U.S. Appl. No. 14/472,781 dated Dec. 13, 2016.
Non-Final Office Action for U.S. Appl. No. 13/905,872 dated Jan. 13, 2017.
International Search Report for Application No. PCT/US 01/09199 dated Oct. 10, 2001.
Francis F Chen and Humberto Torreblanca, "Large-area helicon plasma source with permanent magnets", Plasma Physics and Controlled Fusion, vol. 49, A81-A93, Mar. 27, 2007.
International Search Report for PCT/KR2010/008798 dated Aug. 22, 2011.
International Search Report for Application No. PCT/KR2012/002179 dated Oct. 4, 2012.
Publication and International Search Report for Application No. 10-2011-0104792 2011 dated Apr. 18, 2013.
International Search Report for Application No. PCT/KR 2013/005072 dated Sep. 17, 2013.
Non-Final Office Action for U.S. Appl. No. 14/082,795 dated Oct. 24, 2014.
Notice of Allowance for U.S. Appl. No. 14/082,795 dated Feb. 20, 2015.
Chinese Office Action for Application No. CN 2010-80070565.7 dated Mar. 25, 2015.
Restriction Requirement for U.S. Appl. No. 14/472,781 dated Aug. 14, 2015.
Notice of Allowance for U.S. Appl. No. 14/574,745 dated Oct. 14, 2015.
International Search Report for Application No. PCT/KR2012/005525 dated Jan. 3, 2013.
Chinese Office Action for Application No. 2012 80047361.0 dated Nov. 23, 2015.
Plasma Pyhs. Control. Fusion, Francis F Chen, Large-area helicon plasma source with permanent magnets.
Notice of Allowance for U.S. Appl. No. 14/574,745 dated Dec. 10, 2015.
Restriction Requirement for U.S. Appl. No. 14/328,867 dated Jan. 5, 2016.
Non-Final Office Action for U.S. Appl. No. 14/472,781 dated Jan. 29, 2016.
Restriction Requirement for U.S. Appl. No. 13/905,872 dated Apr. 29, 2016.
IPRP and Written Opinion for Application No. PCT/KR2012/005525 dated Feb. 4, 2014.

\* cited by examiner

PLASMA GENERATION APPARATUS AND PLASMA GENERATION METHOD

CROSS-REFERENCE TO RELATED APPLICATIONS

This application is a continuation of and claims priority to PCT/KR2012/005525 filed on Jul. 12, 2012, which claims priority to Korea Patent Application No. 10-2011-0076585 filed on Aug. 1, 2011, the entirety of which is hereby incorporated by reference.

BACKGROUND

1. Field of the Invention

The present invention relates to plasma generation apparatuses and, more particularly, to remote plasma generation apparatuses.

2. Description of the Related Art

A remote plasma generation apparatus generates radicals using plasma and provides the generated radicals into a process chamber to perform a cleaning process or the like. That is, there is a difference between a position where the plasma is generated by the remote plasma generation apparatus and a position where a process is practically performed.

SUMMARY

Embodiments of the present invention provide a plasma generation apparatus, a plasma generation method, and a plasma initial discharge apparatus of inductively-coupled plasma.

According to an aspect of the present invention, a plasma generation apparatus according to an embodiment of the present invention may include a chamber including a dielectric window and a toroidal discharge space; a magnetic core disposed to surround a portion of the chamber; an induction coil disposed to wind the magnetic core; and a waveguide radiating a microwave through the dielectric window. Alternating current flowing in the induction coil forms a magnetic flux at the magnetic core, and the magnetic flux generates inductively-coupled plasma. A microwave propagating along the waveguide generates microwave plasma inside the chamber.

In an example embodiment, the chamber may be made of a conductor and include an insulating spacer blocking induced current.

In an example embodiment, the chamber may include first to fourth bodies. The first to fourth bodies may be sequentially connected to provide a toroidal discharge space. The magnetic core may include a first magnetic core and a second magnetic core. The first magnetic core may be disposed to surround the first body, and the second magnetic core may be disposed to surround the third body.

In an example embodiment, the first body and the third body may be electrically floated.

In an example embodiment, the waveguide may include a first waveguide with a first slit and a second waveguide with a second slit. The dielectric window may include a first dielectric window and a second dielectric window. The first dielectric window may be mounted on the second body, and the second dielectric window may be mounted on the fourth body. The first slit may provide a microwave to the second body through the first dielectric window, and the second slit may provide a microwave to the fourth body through the second dielectric window.

In an example embodiment, the waveguide may include a first slit and a second slit. The dielectric window may include a first dielectric window and a second dielectric window. The first dielectric window may be mounted on the second body, and the second dielectric window may be mounted on the fourth body. The first slit may provide a microwave to the second body through the first dielectric window, and the second slit may provide a microwave to the fourth body through the second dielectric window.

In an example embodiment, the chamber may further include a gas inlet adapted to supply an initial discharge gas and a process gas; and a gas outlet adapted to vent a dissociated gas. The gas inlet may be mounted on the first body, and the gas outlet may be mounted on the third body.

In an example embodiment, the chamber may further include a gas inlet adapted to supply an initial discharge gas and a process gas; and a gas outlet adapted to discharge a dissociated gas. The gas inlet may be mounted on the second body, and the gas outlet may be mounted on the fourth body.

In an example embodiment, the third body and the fourth body may further include depressions, respectively. The first magnetic core may be combined with the depression of the first body, and the second magnetic core may be combined with the depression of the third body.

In an example embodiment, the second body or the fourth body may include a top plate and a bottom plate. A trench may be formed at one surface of the top plate, and a trench may be formed at one surface of the bottom plate. The trench of the top plate and the trench of the bottom plate may be combined to form the discharge space.

In an example embodiment, the induction coil may include a first induction coil disposed to wind the first magnetic core; and a second induction coil disposed to wind the second magnetic core. The first induction coil may be connected to a first alternating current power supply, and the second induction coil may be connected to a second alternating current power supply.

In an example embodiment, the plasma generation apparatus may further include a cooling block disposed between the waveguide and the dielectric window.

In an example embodiment, the plasma generation apparatus may further include at least one of a microwave generator configured to provide a microwave to the waveguide, a tuner for impedance matching disposed between the microwave generator and the waveguide, a directional coupler disposed between the microwave generator and the waveguide to extract some of a reflection wave or a propagation wave, an isolator, a dummy load consuming a reflection wave, and a circulator configured to provide a propagation wave of the microwave generator to the waveguide and provide a reflection wave reflected from a load to the dummy load.

In an example embodiment, the chamber may have a square-shaped internal cross section.

In an example embodiment, the magnetic core may be a ferrite or nano-crystalline core.

In an example embodiment, the waveguide may have a rectangular cross section.

In an example embodiment, the dielectric window may have a plate shape. The dielectric window may include at least one of quartz, alumina, ceramic, sapphire, aluminum nitride, and a combination thereof.

In an example embodiment, each of the first and third bodies may be an insulator, and each of the second and fourth bodies may be a conductor.

In an example embodiment, the first to fourth bodies may be electrically insulated by an insulating spacer.

According to another embodiment of the present invention, a plasma generation apparatus may include a magnetic core forming a closed loop; a chamber disposed to penetrate the closed loop of the magnetic core and including at least one discharge space of a closed loop and a dielectric window; an induction coil disposed to wind the magnetic core; and a waveguide including a slit and radiating a microwave through the slit and the dielectric window. Alternating current flowing in the induction coil forms a magnetic flux at the magnetic core, and the magnetic flux generates inductively-coupled plasma inside the chamber. A microwave propagating along the waveguide generates microwave plasma inside the chamber.

According to further another embodiment of the present invention, a plasma generation apparatus may include a magnetic core forming a closed loop; a chamber disposed to penetrate the closed loop of the magnetic core and including at least one discharge space of a closed loop and an opening; an induction coil disposed to wind the magnetic core; a dielectric window disposed on the opening; and a waveguide including a slit and radiating a microwave through the slit and the dielectric window. Alternating current flowing in the induction coil forms a magnetic flux at the magnetic core, and the magnetic flux generates inductively-coupled plasma. A microwave propagating along the waveguide generates microwave plasma inside the chamber.

According to another aspect of the present invention, a plasma generation method may include supplying an initial discharge gas or a process gas into a chamber including a dielectric window and a toroidal discharge space; providing a microwave through the dielectric window to generate microwave plasma in the toroidal discharge space; and providing an alternating current power to an induction coil winding a magnetic core surrounding the chamber to generate inductively-coupled plasma in the discharge space.

In an example embodiment, the plasma generation method may further include supplying a dissociated gas dissociated by plasma inside the chamber to a process chamber to perform a cleaning process for the process chamber.

In an example embodiment, the initial discharge gas may include at least one of an inert gas and a nitrogen gas, and the process gas may include at least one of a fluorine-containing gas and an oxygen gas.

In an example embodiment, the plasma generation method may further include changing a flow rate of the initial discharge gas and the process gas.

According to further another aspect of the present invention, a plasma initial discharge apparatus of inductively-coupled plasma may include a chamber including a dielectric window and at least one discharge space of a closed loop; and a waveguide including a slit and radiating a microwave through the slit and the dielectric window. A microwave propagating along the waveguide discharges initial plasma using a microwave inside the chamber.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION

Figure 1:
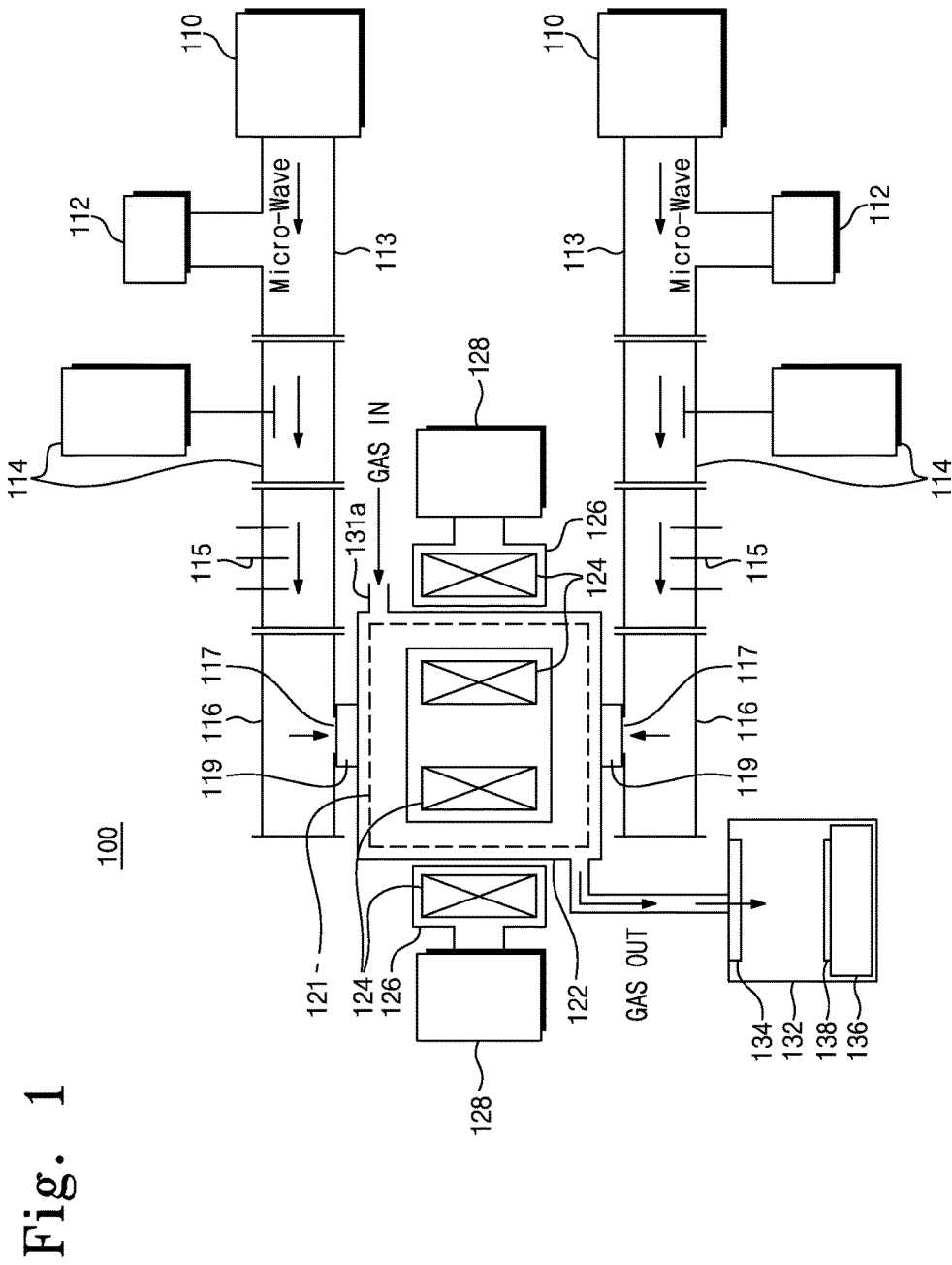
FIG. 1 is a conceptual diagram of a plasma generation apparatus according to an embodiment of the present invention.

A first-generation remote plasma generation apparatus for cleaning employs a microwave plasma generation apparatus. However, a microwave plasma generation apparatus suffers from disadvantages such as a limitation in processing a high rate of flow, a large volume in structure, and high-cost parts such as a waveguide. In addition, since a microwave power is spatially concentrated to be provided to an insulator tube, the insulator tube should be replaced periodically. Therefore, it is difficult to maintain the first-generation remote plasma generation apparatus.

A second-generation remote plasma generation apparatus for cleaning employs an inductively-coupled toroidal plasma generation apparatus. Although inductively-coupled toroidal plasma may process a higher rate of flow than microwave plasma, it suffers from difficulty in initial discharge. Therefore, the inductively-coupled toroidal plasma generation apparatus conventionally uses a capacitively-coupled electrode for ignition.

However, an ignition electrode requires a high voltage. When a high voltage is applied to the ignition electrode, the ignition electrode and an adjacent chamber are vulnerable to sputtering. A sputtered material reduces durability of the chamber and flows into the chamber to serve as a contaminant. When discharging a process gas such as nitrogen trifluoride ($NF_3$), the inductively-coupled toroidal plasma generation apparatus fails to keep the discharging and is turned off. The discharging is kept by supplying an initial discharge gas such as argon (Ar) into a chamber and applying a high voltage to an ignition electrode. Thereafter, the process gas is injected to generate process gas plasma. Thus, since initial discharge is repeatedly conducted when the discharging of the process gas is unstable, process time increases.

Accordingly, there is a requirement for a remote plasma generation apparatus which exhibits high discharge stability even against a process gas such as nitrogen trifluoride ($NF_3$) and is capable of processing a high rate of flow.

The present invention will be described more fully hereinafter with reference to the accompanying drawings, in which preferred embodiments of the invention are shown. This invention may, however, be embodied in many different forms herein. Rather, these embodiments are provided so that this disclosure will be thorough and complete, and will fully convey the scope of the invention to those skilled in the art. In the drawings, like numbers refer to like references.

FIG. 1 is a conceptual diagram of a plasma generation apparatus 100 according to an embodiment of the present invention.

Referring to FIG. 1, the plasma generation apparatus 100 includes a chamber 122 with a dielectric window 119 and a toroidal discharge space 121, a magnetic core 124 disposed to surround a portion of the chamber 122, an induction coil 126 disposed to surround the magnetic core 124, and a waveguide 116 disposed to radiate a microwave through the dielectric window 119.

Alternating current (AC) flowing through the induction coil 126 causes a magnetic flux to be formed at the magnetic core 124, and the magnetic flux causes inductively-coupled plasma to be generated inside the chamber 122. A microwave traveling through the waveguide 116 causes microwave plasma to be generated inside the chamber 122.

The chamber 122 may be a conductor. The chamber 122 includes an insulating spacer (not shown) to block induced current generated in the chamber 122. The chamber 122 may form at least a closed path. The chamber 122 may form a toroidal discharge space 121. The chamber 122 may be formed of a plurality of electrically insulated parts.

An inner cross section of the chamber 122 may be rectangular. The rectangular cross section may be a structure for easily receiving a microwave. The chamber 122 may be cooled by a refrigerant. An internal discharge space of the chamber 122 may be coated with an insulator. Alternatively, a dielectric pipe may be inserted into a part of the discharge space. The dielectric pipe may prevent the chamber 122 from being corroded by a corrosive gas. For example, the chamber 122 is made of aluminum and the discharge space is anodized to be coated with aluminum oxide.

An outer surface of the chamber 122 may be heated by an induced electric field. A surface of the chamber 122 may include a plurality of trenches to block an induced current path caused by the induced electric field. The trench may be disposed across the induced electric field.

The chamber 122 may include a gas inlet 131a and a gas outlet 131b. The gas inlet 131a allows an initial discharge gas and a process gas to be supplied into the chamber 122. The initial discharge gas may include at least one of inert gases and nitrogen gases. The process gas may include at least one of fluorine-containing gases and oxygen gases. The gas outlet 131b allows a gas dissociated by plasma to be vented. The gas inlet 131a may include two entrances. That is, an entrance supplying the initial discharge gas and an entrance supplying the process gas may be different from each other. An inner cross section of the gas inlet 131a or an inner cross section of the gas outlet 131b may be identical to that of the chamber 122.

The dielectric window may be made of a material which allows micro wave to pass through and may keep a vacuum state. The material of the dielectric window 119 may be one selected from the group consisting of quartz, alumina, sapphire, aluminum nitride, aluminum oxide or a combination thereof. The dielectric window 119 may be in the form of plate. However, the dielectric window 119 may be modified according to the shape of the chamber 122.

For example, the dielectric window 119 may include at least one of a conductive thin film and an insulating thin film that are sequentially stacked on an insulator plate. The conductive thin film may be coated with a conductive material of high thermal conductivity. However, the conductive thin film may have an opening corresponding to a slit 117. The microwave may be transmitted to the inside of the chamber 122 through the opening. The conductive thin film allows the dielectric window 119 to be cooled.

The waveguide 116 includes the slit 117, and the slit 117 radiates the microwave. The microwave is transmitted to the inside of the chamber 122 through the slit 117 and the dielectric window 119. The microwave transmitted to the inside of the chamber 122 generates microwave plasma. A cooling block for cooling may be additionally disposed between the dielectric window 119 and the waveguide 116. The waveguide 116 may be a rectangular waveguide.

One end of the waveguide 116 is connected to a microwave generator, and the other end thereof is blocked by a metal plate. Accordingly, the microwave is radiated through the slit 117. The waveguide 117 may be disposed at the outer side or the inner side of the chamber 122 to have symmetry.

The microwave plasma is locally generated by a strong electromagnetic wave. Thus, an area contacting the microwave plasma may be heated. Particularly, when a fluorine-containing gas is discharged, the heated dielectric window 119 may be easily etched. For preventing this, a cooling block may be disposed between the waveguide 116 and the dielectric window 119. The cooling block cools the dielectric window 119. The cooling block may be a material of high thermal conductivity such as aluminum. The cooling block may be cooled by a refrigerant or pressurized air.

The microwave generator 110 provides a microwave to the waveguide 116. A frequency of the microwave generator 110 may be 1 GHz to 20 GHz. A power of the microwave generator 110 may be tens of watts (Watt) or several kilowatts (kWatt). The microwave generator 110 may be a magnetron of 2.45 GHz. Since a magnetron for use in a home microwave oven is low-priced and compact, the microwave generator 110 may generate microwave plasma at low cost.

A tuner 115 for impedance matching may be selectively disposed between the microwave generator 110 and the waveguide 116. The tuner 115 may be a stub tuner or a plunger. The stub tuner may be disposed between the waveguide 116 and the microwave generator 110 to minimize a reflective wave. The plunger may be inserted in the end of the waveguide 116.

A directional coupler 114 is disposed between the microwave generator 110 and the waveguide 116 to extract some of a reflective wave or a traveling wave. A dummy load may selectively consume the reflective wave. A circulator 113 may is a tri-port element which may transfer the traveling wave of the microwave generator 110 to the waveguide 116 and provides a reflective wave reflected from the waveguide 116 from a load to the dummy load 112. An isolator is a bi-port element which may transfer the traveling wave of the microwave generator 110 to the waveguide 116 and block the reflective wave.

The magnetic core 124 may be a ferrite or nano-crystalline core. In case of a nano-crystalline core, permeability is 15000 or higher. Thus, the magnetic core 124 may decrease in volume and heat loss caused by hysteresis may be reduced. The magnetic core 124 may form a closed loop. Thus, a magnetic flux may be concentrated at the magnetic core 124. The magnetic core 124 may be divided into a plurality of parts to reduce heat loss caused by eddy current of the magnetic core 124. The magnetic core 124 may be disposed to surround a portion of the chamber 122.

The induction coil 126 may be made of a high-conductivity material such as copper or silver. The induction coil 126 may have a wide belt shape. The induction coil 126 may be coated with an insulator to be insulated from the chamber 122.

The induction coil 126 is connected to an AC power supply 128. A frequency of the AC power supply 128 may be 10 kHz to 10 MHz. Preferably, the frequency of the AC power supply 128 may be 100 kHz to 1 MHz. A power of the AC power supply 128 increases in proportion to processing capacity but may be conventionally several kilowatts to hundreds of kilowatts.

Alternating current (AC) flowing through the induction coil 126 induces a magnetic flux to the magnetic core 124. The time-varying magnetic flux induces an induced electric field in an axis direction of the magnetic core 124. The induced electric field generates inductively-coupled plasma in a discharge space inside the chamber 122. In addition, the induced electric field allows heat to be generated inside a conductive chamber by ohmic heating. The chamber 122 may be formed of a plurality of parts to reduce the ohmic heating.

A pressure of the chamber 122 may be hundreds of milliTorr (mTorr) to hundreds of Torr. Due to use of a process gas at a pressure of tens of Torr or higher, inductively-coupled plasma fails to keep being discharged. However, a plasma generation apparatus according to an embodiment of the present invention may keep the discharging with the use of a process gas at a pressure of tens of Torr or higher through the help of microwave discharge. Moreover, the plasma generation apparatus according to an embodiment of the present invention may process a flow of at least tens of percent higher than a flow that can be processed only by inductively-coupled plasma. The increase in the processing flow results from the synergy effect caused by coupling of a stable microwave plasma discharge and an inductively-coupled plasma discharge. An operating voltage of AC power supply may decrease due to initial discharge easiness arising from the microwave plasma discharge. Thus, the price of the AC power supply may be reduced.

Characteristics of inductively-coupled plasma and characteristics of microwave plasma are different from each other. Therefore, the plasma generation apparatus according to an embodiment of the present invention may be applied to fields to which the inductively-coupled plasma cannot be applied. For example, the plasma generation apparatus may operate even at a pressure approximate to the atmospheric pressure and thus may be applied to waste treatment, a sterilization process using ozone as a sterilant, and the like.

The gas outlet 131*b* may supply a dissociated process gas to a process container 132. The process container 132 may perform an etching process, a deposition process, an ashing process, and the like. In case of the deposition process, the process container 132 receives a separate deposition process gas. The process container 132 may include a gas distributer 134, a substrate 138, and a substrate holder 136. The substrate 138 may be a semiconductor substrate, a glass substrate, and a metal substrate. When the process container 132 is contaminated, the plasma generation apparatus may supply the dissociated process gas to the process container 132 to perform a cleaning process.

With the increase in substrate size, the process container 132 increases in volume. Thus, the plasma generation apparatus may supply a process gas of several standard liter per minute (SLM) to hundreds of SLM into the process container 132.

A plasma generation method according to an embodiment of the present invention includes supplying an initial discharge gas and/or a process gas into a chamber with a dielectric window and a toroidal discharge space. Thereafter, a microwave generator provides a microwave through the dielectric window to generate microwave plasma. An alternating current (AC) power supply supplies AC power to an induction coil winding a magnetic core surrounding the chamber to generate inductively-coupled plasma inside the chamber.

The initial discharge gas may be an inert gas such as argon gas or a nitrogen gas that is easy on initial discharge. The process gas may be a fluorine-containing gas or an oxygen gas.

Specifically, the process gas may be $NF_3$ and the initial gas may be an argon gas. A dissociated gas dissociated by plasma inside the chamber may be supplied into a process chamber to perform a cleaning process.

Conventionally, inductively-coupled plasma is discharged at a low pressure using an initial discharge gas, and a process gas is injected into a chamber while increasing the pressure. Therefore, a standby time to dissociation of the process gas is long.

However, in the plasma generation method, a process gas and an initial discharge gas may be simultaneously injected at a high pressure. A ratio of the process gas to the initial discharge gas may be 5 percent or more. Since a microwave is easily and stably discharged even at a high pressure, the process gas may be discharged by adjusting a flow rate of the process gas and the initial discharge gas. Thus, the standby time is significantly reduced.

Although inductively-coupled plasma uses a capacitively-coupled electrode, capacitively-coupled plasma is easily discharged as an area of the electrode increases. There is a limitation in increasing an area of a capacitively-coupled electrode. The increase in area of the capacitively-coupled electrode results in sputtering. Moreover, there is a requirement for a high-voltage power supply causing a separate high voltage. Separate cost is required for the high-voltage power supply. Since the capacitively-coupled plasma uses a strong electric field, the capacitively-coupled plasma is vulnerable to an arc due to the use of a strong electric field. Even when generating inductively-coupled plasma, the capacitively-coupled electrode may generate an arc. Once an arc is generated, the arc is repeatedly generated to significantly reduce the lifetime of the system.

However, since initial discharge according to the present invention uses a microwave, an arc does not occur. Moreover, there is no sputtering problem that occurs at the capacitively-coupled plasma. When a process gas is discharged only using the inductively-coupled plasma, the discharge is easily stopped.

However, the plasma generation apparatus according to an embodiment of the present invention may eliminate discharge instability because microwave discharge is always maintained. Due to the elimination of the discharge instability, the plasma generation apparatus may easily increase a processing flow rate. In addition, the processing flow rate may further increase through combination of microwave plasma and inductively-coupled plasma.

A breakdown voltage for generating secondary side plasma covering a magnetic core (or applied voltage of a primary side coil) may more greatly decrease at argon (Ar) when an igniter using microwave plasma is used than when a conventional igniter using a capacitively-coupled electrode is used. Specifically, the applied voltage of a primary side coil may decrease by about one-third. Since the decrease in the applied voltage of a primary side coil may help output stability of an AC power supply and the initial discharge is performed using a small voltage, arching of the chamber inside caused by a high voltage generated during the initial discharge may be significantly reduced. The AC power supply may operate at a low voltage.

Additionally, microwave discharge may be performed only using a microwave generator and a waveguide. In the case that the microwave generator uses a magnetron for home appliance, the equipment for microwave discharge is not expensive.

Figure 2:
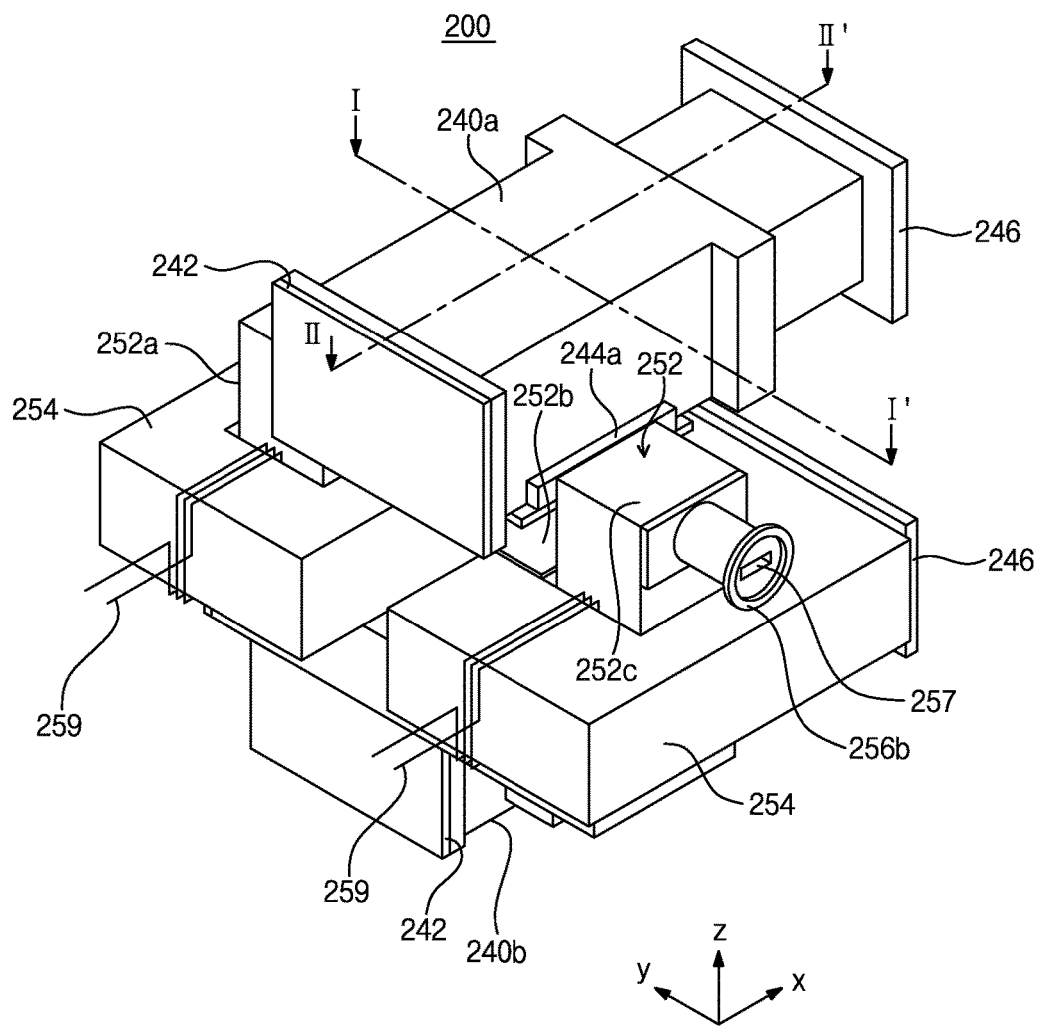
FIG. 2 is a perspective view of a plasma generation apparatus according to an embodiment of the present invention.

FIG. 2 is a perspective view of a plasma generation apparatus 200 according to an embodiment of the present invention.

Figure 3:
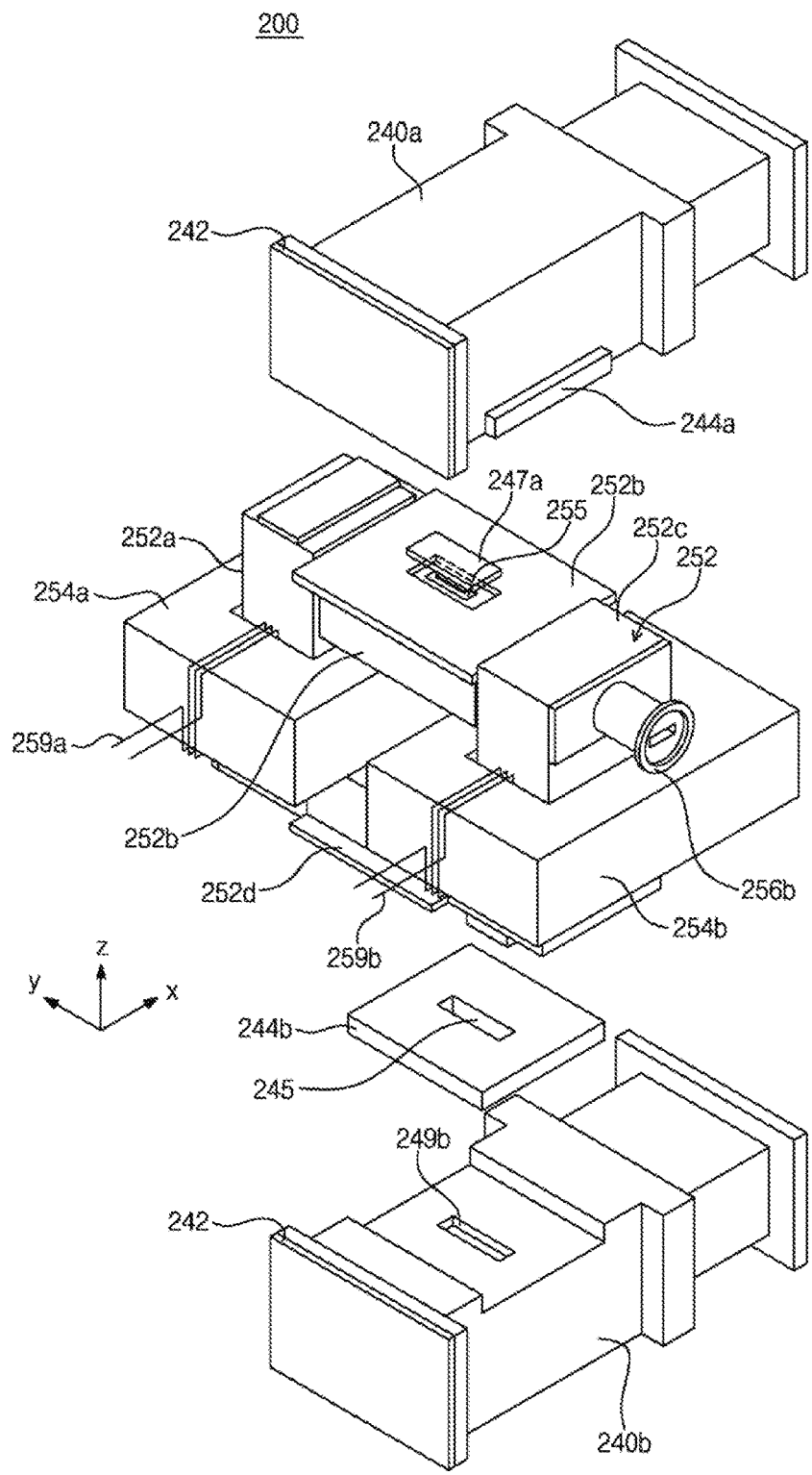
FIG. 3 is an exploded perspective view of the plasma generation apparatus in FIG. 2.

FIG. 3 is an exploded perspective view of the plasma generation apparatus in FIG. 2.

Figure 4:
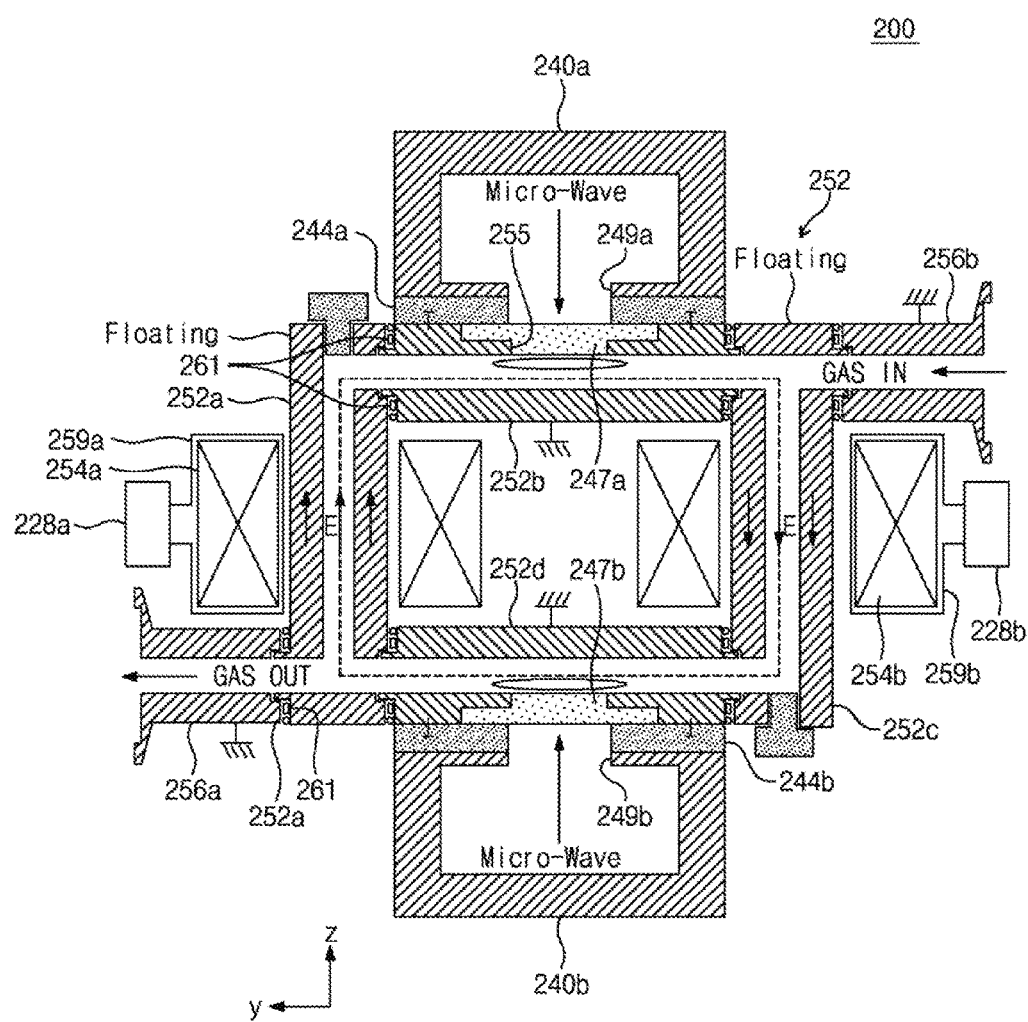
FIG. 4 is a cross-cross sectional view taken along the line I-I' in FIG. 2.

FIG. 4 is a cross-cross sectional view taken along the line I-I' in FIG. 2.

Figure 5:
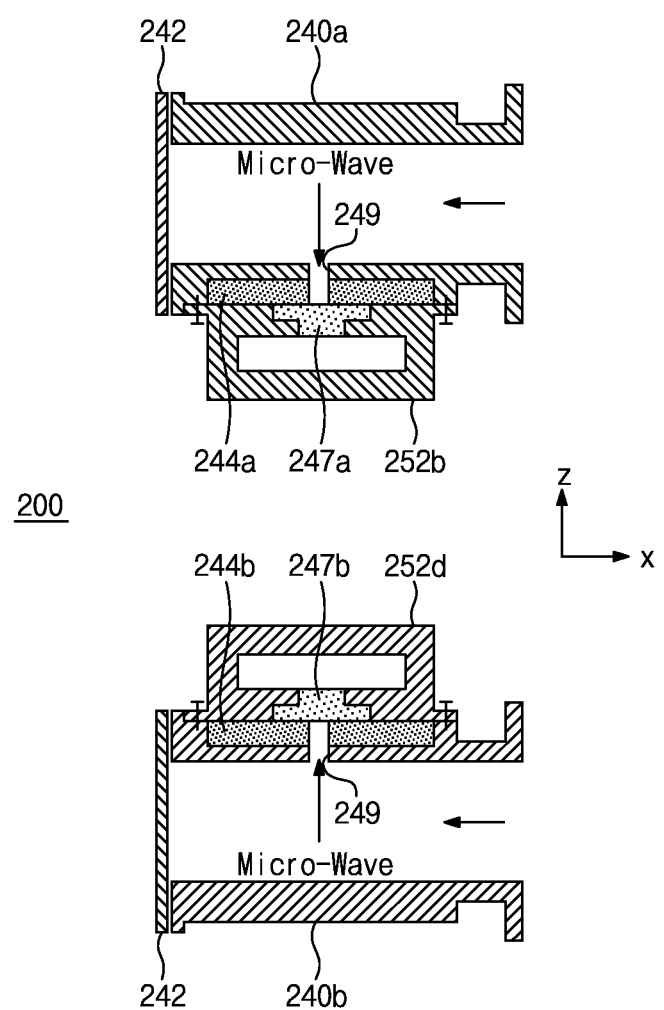
FIG. 5 is a cross-cross sectional view taken along the line II-II' in FIG. 2.

FIG. 5 is a cross-cross sectional view taken along the line II-II' in FIG. 2.

Referring to FIGS. 2 to 5, the plasma generation apparatus 200 includes a chamber 252 with dielectric windows 247a and 247b and a toroidal discharge space, magnetic cores 254a and 254b disposed to surround a portion of the chamber 252, induction coils 259a and 259b disposed to wind the magnetic cores 254a and 254b, and waveguides 240a and 240b radiating a microwave through the dielectric windows 247a and 247b. Alternating current (AC) flowing in the induction coils 259a and 259b forms a magnetic flux at the magnetic cores 254a and 254b. The magnetic flux generates inductively-coupled plasma inside the chamber 252. A microwave propagating along the waveguides 240a and 240b generates microwave plasma at the chamber 252.

The chamber 252 may be made of a conductive material. The conductive material may be aluminum. The chamber 252 may include first to fourth bodies 252a-252d. The first to fourth bodies 252a-252d may be sequentially connected to provide a toroidal discharge space. The first to fourth bodies 252a-252d may be electrically insulated from each other through an insulating spacer 261.

The first body 252a may have the shape of a rectangular pillar aligned in the z axis direction. A hole may be formed in the first body 252a. The hole may include a first hole, a second hole, and a third hole. The first hole may be formed at one end of the first body 252a to penetrate in the −y axis direction. The second hole may be connected in the center of the first hole and extend in the z axis direction. The third hole may be connected the second hole at the other end of the first body 252a to extend in the −y axis direction.

A gas outlet 256a may be disposed to be connected to the first hole. The gas outlet 256a may have the same shape as the first hole. The gas outlet 256a may be combined with the first body 252a while being electrically insulated through the insulating spacer 261. The gas outlet 256a may be grounded. The first body 252a may be cooled by a refrigerant. The gas outlet 256a may have the same cross section as the first body 252a.

A first magnetic core 254a is disposed in the circumference of the first body 252a. The first magnetic core 254a may be a ferrite or nano-crystalline core. A first induction coil 259a is disposed to wind the first magnetic core 254a. The first induction coil 259a is connected to a first AC power supply 228a. The first induction coil 259a forms a first coil of a transformer, and inductively-coupled plasma generated at the chamber 252 forms a second coil of the transformer. Current flowing in the first induction coil 259a induces a magnetic flux to the first magnetic core 254a, and time varying magnetic flux causes an induced electric field to be formed inside the chamber 252. The induced electric field generates inductively-coupled plasma. The first body 252a may be electrically floated such that the chamber 252 does not play as the second coil of the transformer.

The second body 252b may be aligned in the y axis direction. The second body 252b may have the shape of a rectangular pillar. A hole may be formed to penetrate the second body 252b in the y axis direction. The hole of the second body 252b is connected to the third hole of the first body 252a to form a discharge space. A first waveguide 240a is disposed at an outer side surface of the second body 252b. The second body 252b may be cooled by a refrigerant.

The first waveguide 240a may be a rectangular waveguide. The first waveguide 240a may be WR284. A first slit 249a may be formed at a contact surface between the first waveguide 240a and the second body 252b. The first slit 249a may allow a microwave propagating along the first waveguide 240a to be radiated in a direction of the first dielectric window 247a. The first slit 249a may have a rectangular or square shape. An elongated direction of the first waveguide 240a may be the x axis direction. At the cross section of the first waveguide 240a, a long-direction (y axis direction) surface may be in contact with the second body 252b. The first slit 249a may extend at the long-direction (y axis direction) surface of the first waveguide 240a in the long direction (y axis direction). One end surface of the first waveguide 240a may receive a microwave from a microwave generator, and the other end surface thereof may be blocked with a conductor plate 242.

The first dielectric window 247a may have a plate shape. Sealing means such as an O-ring may be disposed between the first dielectric window 247a and the second body 252b.

A first cooling block 244a may be disposed between the first waveguide 240a and the second body 252b. The first cooling block 244a may include a through-hole. The through-hole of the first cooling block 244a may allow a microwave radiated through the first slit 249a to be transmitted into an opening 255 of the chamber 252 through the first dielectric window 247a. The first dielectric window 247a may be disposed at the opening 255. The first cooling block 244a may be cooled through a refrigerant. Thus, the first cooling block 244a may cool the first dielectric window 247a.

The third body 252c may have the same structure as the first body 252a. The third body 252c may have the shape of a rectangular pillar aligned in the z axis direction. The third body 252c may include a first hole, a second hole, and a third hole. The first hole may be a through-hole formed at one end of the third body 252c in the y axis direction. The second hole may be may be connected to the first hole to extend in −z axis direction. The third hole may be connected the second hole at the other end of the third body 252c to extend in the y direction. The first hole is connected to a hole of the second body 252b. A gas inlet 256b is connected to the first hole to supply an initial discharge gas and a process gas. The gas inlet 256b may have the same cross section as the third body 252c.

The gas inlet 256b may be grounded, and the third body 252c may be floated. Accordingly, an insulating spacer 261 may be disposed at a contact portion between the gas inlet 256b and the third body 252c to electrically insulate the portion. A second magnetic core 254b may be wound around the third body 252c. The second magnetic core 254b may have the same structure as the first magnetic core 254a. The second magnetic core 254b may be a ferrite material or a nano-crystalline material. The second induction coil 259b is disposed to wind the second magnetic core 254b. The second induction coil 259b is connected to a second AC power supply 228b. Alternating current (AC) flowing in the second induction coil 259b induces a magnetic flux to the second magnetic core 254b. The magnetic flux forms an induced electric field at the third body 252c, and the induced electric field generates inductively-coupled plasma in a discharge space. A direction of an induced electric field induced by the first AC power supply 228 and a direction of an induced electric field induced by the second AC power supply 228b may be opposite to each other.

The fourth body 252d may have the same structure as the second body 252b. A second waveguide 240b is disposed at an outer side of the fourth body 252d. A second slit 249b of the second waveguide 240b may be disposed at a surface that is in contact with the fourth body 252d. The fourth body 252d includes a second dielectric window 247b. The second slit 249b radiates a microwave to transmit the microwave into the fourth body 252d through the second dielectric window 247b. The microwave generates microwave plasma. One end surface of the second waveguide 240b may receive a microwave from a microwave generator, and the other end surface thereof may be blocked with a conductor plate 242.

The second cooling block 244b may be disposed between the second waveguide 240b and the fourth body 252d. The second cooling block 244b may include a through-hole. The through-hole of the second cooling block 244b may allow a microwave radiated through the second slit 249b to be transmitted into the chamber 252 through the second dielectric window 247b. The fourth body 252d may be combined with the first body 252a through the insulating spacer 261.

The inner discharge spaces of the first to fourth bodies 252a-252d may each have rectangular cross sections. The first and third bodies 252a and 252c may be electrically floated, and the second and fourth bodies 252b and 252d may be electrically grounded.

Inductively-coupled plasma is mainly generated at the first and third bodies 252a and 252c, and microwave plasma is mainly generated at the second and fourth bodies 252b and 252d. Accordingly, there may be a distinction between an area where the inductively-coupled plasma is generated and an area where the microwave plasma is generated. The microwave plasma may be diffused to migrate to the area where the inductively-coupled plasma is generated. Inductively-coupled efficiency may be in proportion to current flowing along a secondary axis of a transformer. The inductively-coupled plasma is mainly generated at the first and third bodies 252a and 252c. When the microwave is not generated at the second and fourth bodies 252b and 252d, the inductively-coupled plasma is almost extinguished by recombination at the second and fourth bodies 252b and 252d. However, in the present invention, the microwave plasma generated at the second and fourth bodies 252b and 252d may form a secondary axis to enhance the inductively-coupled plasma efficiency.

According to a modified embodiment of the present invention, a slit for radiating the microwave may be formed at the conductor plate 242. The conductor plate 242 where the slit is formed may be disposed in contact with the dielectric window.

Figure 6:
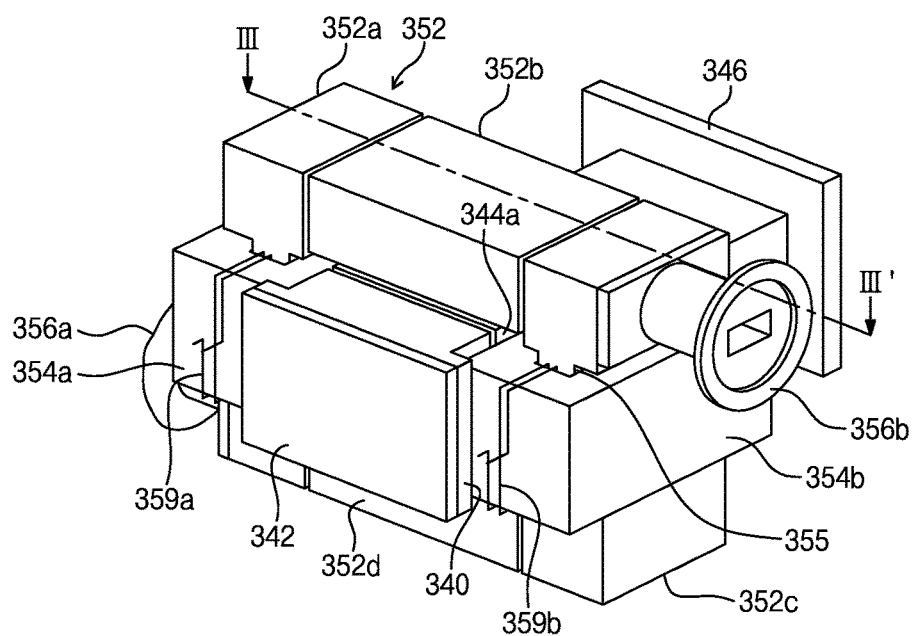
FIG. 6 is a perspective view of a plasma generation apparatus according to another embodiment of the present invention.

FIG. 6 is a perspective view of a plasma generation apparatus 300 according to another embodiment of the present invention.

Figure 7:
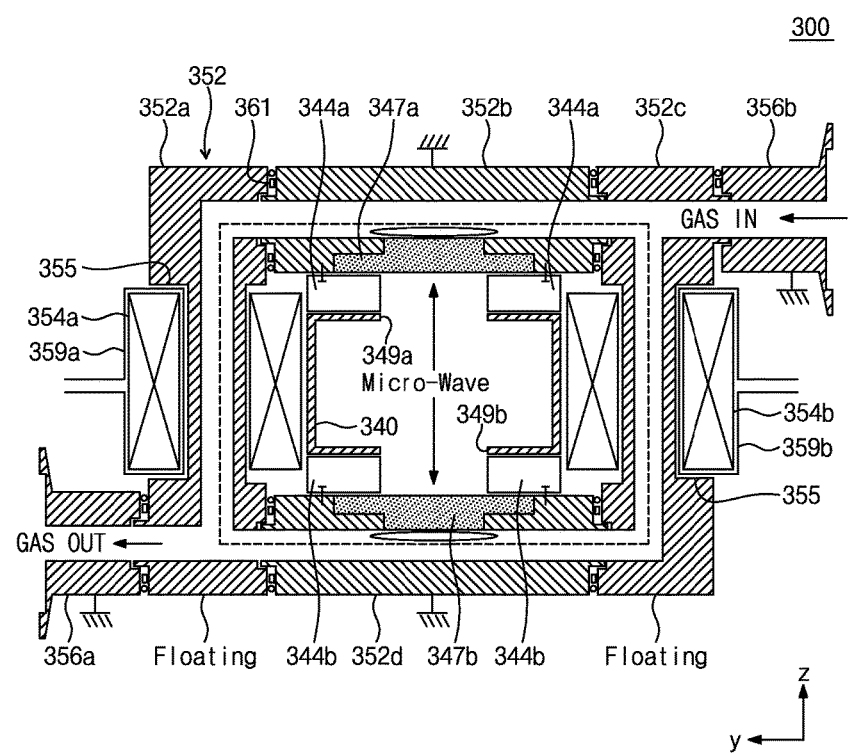
FIG. 7 is a cross-cross sectional view taken along the line III-III' in FIG. 6.

FIG. 7 is a cross-cross sectional view taken along the line III-III' in FIG. 6.

Referring to FIGS. 6 and 7, the plasma generation apparatus 300 includes a chamber 352 with dielectric windows 347a and 347b and a toroidal discharge space, magnetic cores 354a and 354b disposed to surround a portion of the chamber 352, induction coils 359a and 359b disposed to wind the magnetic cores 354a and 354b, and waveguides 340a and 340b radiating a microwave through the dielectric windows 347a and 347b. Alternating current (AC) flowing in the induction coils 259a and 259b form a magnetic flux, and the magnetic flux generates inductively-coupled plasma inside the chamber 352. A microwave propagating along the waveguide 340 generates microwave plasma at the chamber 352.

The chamber 352 may be made of a conductive material. The conductive material may be aluminum. The chamber 352 may include first to fourth bodies 352a-352d. The first to fourth bodies 352a-352d may be sequentially connected to provide a toroidal discharge space. The first to fourth bodies 352a-352d may be insulated from each other through an insulating spacer 361.

The first body 352a may have the shape of a rectangular pillar aligned in the z axis direction. A hole may be formed in the first body 352a. The hole may include a first hole, a second hole, and a third hole. The first hole may be formed at one end of the first body 352a to penetrate in the −y axis direction. The second hole may be connected in the center of the first hole and extend in the z axis direction. The third hole may be connected the second hole at the other end of the first body 352a to extend in the −y axis direction. A port may be mounted at the other end of the first body. The gas outlet 356a may be disposed to be connected to the first hole. The gas outlet 356a may have the same shape as the first hole. The gas outlet 356a is combined with the first body 352a while being electrically insulated through the insulating spacer 361. The gas outlet 356a may be grounded. The first body 352a may be cooled by a refrigerant. The gas outlet 356a may have the same cross section as the first body 352a. The first body 352a includes a depression 355 at its outer side surface.

A first magnetic core 354a is disposed at the depression 355 of the first body 352a. The first magnetic core 354a may be a ferrite or nano-crystalline core. A first induction coil 359a is disposed to wind the first magnetic core 354a. The first induction coil 359a is connected to a first AC power supply. The first induction coil 359a forms a first coil of a transformer, and inductively-coupled plasma generated at the chamber 352 forms a second coil of the transformer. Current flowing in the first induction coil 359a induces a magnetic flux to the first magnetic core 354a, and time varying magnetic flux causes an induced electric field to be formed inside the chamber 352. The induced electric field generates inductively-coupled plasma. The first body 352a may be electrically floated such that the chamber 352 does not play as the second coil of the transformer.

The second body 352b may be aligned in the y axis direction. The second body 352b may have the shape of a rectangular pillar. A hole may be formed to penetrate the second body 352b in the y axis direction. The hole of the second body 352b is connected to the third hole of the first body 352a to form a discharge space.

A waveguide 340 is disposed between the second body 352b and the fourth body 352d. The second body 352b may be cooled by a refrigerant.

The waveguide 340 may be a rectangular waveguide. The waveguide 340 may be WR284. A first slit 349a may be formed at a contact surface between the waveguide 340 and the second body 352b, and a second slit 349b may be formed at a contact portion between the waveguide 340 and the fourth body 352d. The first slit 349a may allow a microwave propagating along the first waveguide 340a to be radiated in a direction of the first dielectric window 347a, and the second slit 349b may allow the microwave propagating along the first waveguide 340a to be radiated in a direction of the second dielectric window 347b. Each of the first and second slits 349a and 349b may have a rectangular or square shape. An elongated direction of the waveguide 340 may be the x axis direction. At the cross section of the waveguide 340, a long-direction (y axis direction) surface may be in contact with the second body 352b and the fourth body 352d The first and second slits 349a and 349b may extend in the long direction (y axis direction). One end surface of the waveguide 340 may receive a microwave from a microwave generator, and the other end surface thereof may be blocked with a conductor plate 342.

The first dielectric window 347a may have a plate shape. Sealing means such as an O-ring may be disposed between the first dielectric window 347a and the second body 352b.

A first cooling block 344a may be disposed between the waveguide 340a and the second body 352b. The first cooling block 344a may include a through-hole. The through-hole of the first cooling block 344a may allow a microwave radiated through the first slit 349a to be transmitted into the chamber 352 through the first dielectric window 347a. The first cooling block 344a may be cooled through a refrigerant. Thus, the first cooling block 344a may cool the first dielectric window 347a.

The third body 352c may have the same structure as the first body 352a. The third body 352c may have the shape of a rectangular pillar aligned in the z axis direction. The third body 352c may include a first hole, a second hole, and a third hole. The first hole may be a through-hole formed at one end of the third body 352c in the y axis direction. The second hole may be may be connected to the first hole to extend in −z axis direction. The third hole may be connected to the second hole at the other end of the third body 352c to extend in the y axis direction. The first hole is connected to a hole of the second body 352b. A gas inlet 356b is connected to the first hole to supply an initial discharge gas and a process gas. The gas inlet 356b may have the same cross section as the third body 352c.

The gas inlet 356b may be grounded, and the third body 352c may be floated. Accordingly, an insulating spacer 361 may be disposed at a contact portion between the gas inlet 356b and the third body 352c to electrically insulate the portion. A second magnetic core 354b may be wound around the third body 352c. The second magnetic core 354b may have the same structure as the first magnetic core 354a. The second magnetic core 354b may be a ferrite material or a nano-crystalline material. The second induction coil 359b is disposed to wind the second magnetic core 354b. The second induction coil 359b is connected to a second AC power supply. Alternating current (AC) flowing in the second induction coil 359b induces a magnetic flux in the second magnetic core 354b. The magnetic flux forms an induced electric field at the third body 352c, and the induced electric field generates inductively-coupled plasma in a discharge space. A direction of an induced electric field induced by the first AC power supply 228 and a direction of an induced electric field induced by the second AC power supply 228b may be opposite to each other.

The fourth body 352d may have the same structure as the second body 352b. A second slit 349b of the second waveguide 340b may be disposed at a surface that is in contact with the fourth body 352d. The fourth body 352d includes a second dielectric window 347b. The second slit 349b radiates a microwave to transmit the microwave into the fourth body 352d through the second dielectric window 347b. The microwave generates microwave plasma.

The second cooling block 344b may be disposed between the waveguide 340 and the fourth body 352d. The second cooling block 344b may include a through-hole. The through-hole of the second cooling block 344b may allow a microwave radiated through the second slit 349b to be transmitted into the chamber 352 through the second dielectric window 347b. The fourth body 352d may be combined with the first body 352a through the insulating spacer 361.

The inner discharge spaces of the first to fourth bodies 352a-352d may each have rectangular cross sections. The first and third bodies 352a and 352c may be electrically floated, and the second and fourth bodies 352b and 352d may be electrically grounded.

Inductively-coupled plasma is mainly generated at the first and third bodies 352a and 352c, and microwave plasma is mainly generated at the second and fourth bodies 352b and 352d. Accordingly, there may be a distinction between an area where the inductively-coupled plasma is generated and an area where the microwave plasma is generated. The microwave plasma may be diffused to migrate to the area where the inductively-coupled plasma is generated.

Figure 8:
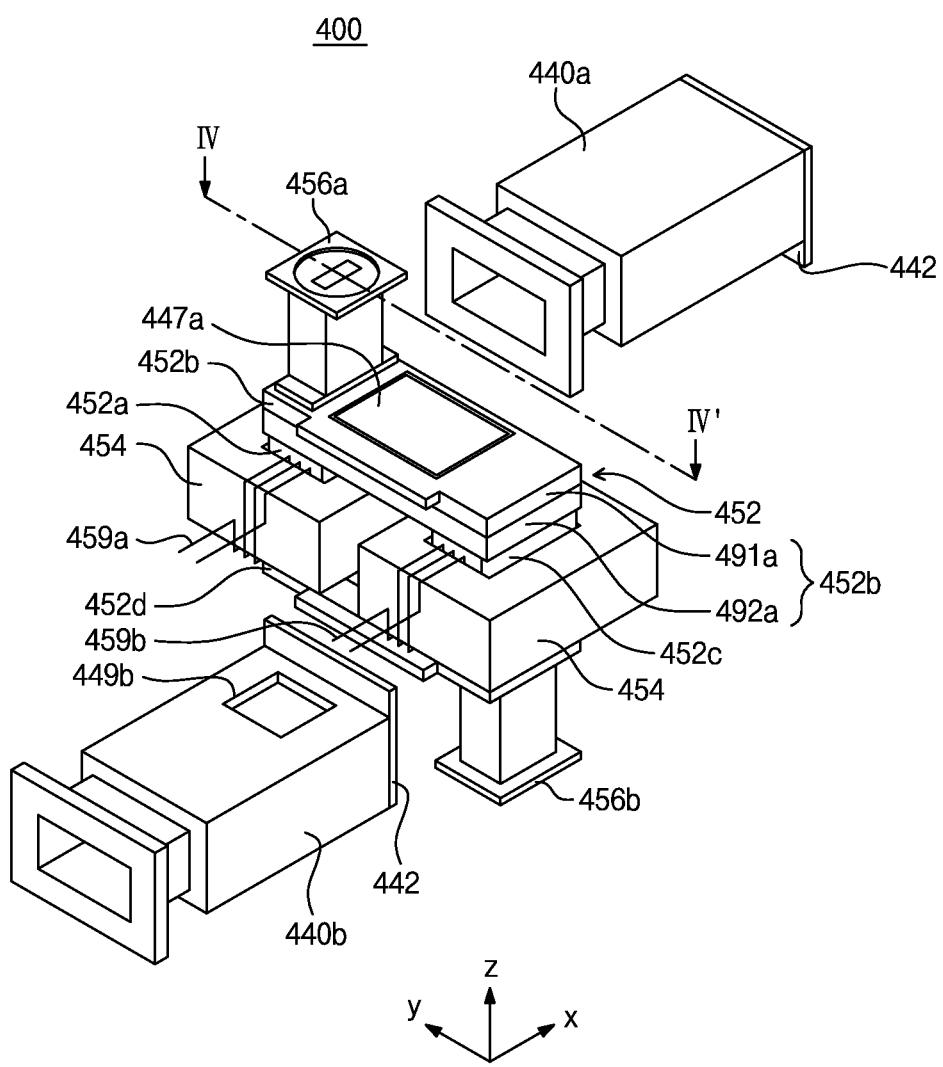
FIG. 8 is an exploded perspective view of a plasma generation apparatus according to another embodiment of the present invention.

FIG. 8 is an exploded perspective view of a plasma generation apparatus 400 according to another embodiment of the present invention.

Figure 9:
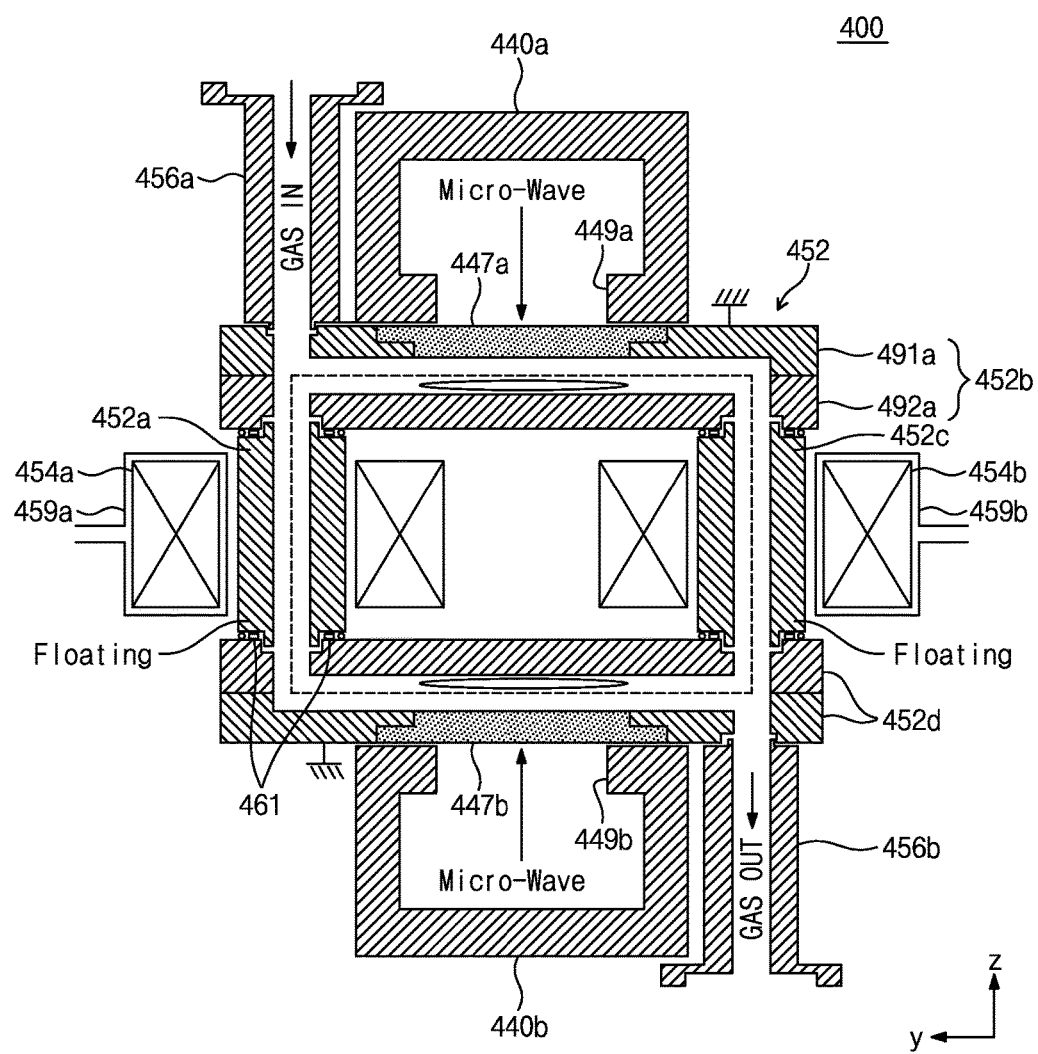
FIG. 9 is a cross-cross sectional view taken along the line IV-IV' in FIG. 8.

FIG. 9 is a cross-cross sectional view taken along the line IV-IV' in FIG. 8.

Referring to FIGS. 8 and 9, the plasma generation apparatus 400 includes magnetic cores 454a and 454b forming a closed loop, a chamber 452 disposed to penetrate the closed loop of the magnetic cores 454a and 454b and including at least one discharge space of a closed loop and dielectric windows 447a and 447b, induction coils 459a and 459b disposed to wind the magnetic cores 454a and 454b, and waveguides 440a and 440b radiating a microwave through slits 449a and 449b and the dielectric windows 447a and 447b. Alternating current (AC) flowing in the induction coils 459a and 459b forms a magnetic flux at the magnetic cores 454a and 454b, and the magnetic flux generates inductively-coupled plasma inside the chamber 452. A microwave propagating along the waveguides 440a and 440b generates microwave plasma inside the chamber 452.

The chamber 452 may be made of a conductive material and/or an insulating material. The conductive material may be aluminum. The chamber 452 may include first to fourth bodies 452a-452d. The first to fourth bodies 452a-452d may be sequentially connected to provide a toroidal discharge space. The first to fourth bodies 452a-452d may be electrically insulated from each other through an insulating spacer 461.

The first body 452a may have the shape of a rectangular pillar aligned in the z axis direction. A hole may be formed in the first body 452a. The hole of the first body 452 may be a hole penetrating in the z axis direction. The first body 452a may be cooled by a refrigerant.

A first magnetic core 454a is disposed in the circumference of the first body 452a. The first magnetic core 454a may be a ferrite or nano-crystalline core. A first induction coil 459a is disposed to wind the first magnetic core 454a. The first induction coil 459a is connected to a first AC power supply. The first induction coil 459a forms a first coil of a transformer, and inductively-coupled plasma generated at the chamber 452 forms a second coil of the transformer. Current flowing in the first induction coil 459a induces a magnetic flux to the first magnetic core 454a, and time varying magnetic flux causes an induced electric field to be formed inside the chamber 452. The induced electric field generates inductively-coupled plasma. The first body 452a may be electrically floated such that the chamber 452 does not play as the second coil of the transformer.

The second body 452b may be aligned in the y axis direction. The second body 452b may include a top late 491a and a bottom plate 492a. A trench is formed at one surface of the top plate 491a, and a trench is formed at one surface of the bottom plate 492a. The trenches of the top and bottom plates 491a and 492a may be combined to form the discharge space. The separated top and bottom plates 491a and 492a are combined to form a discharge path. There is ease in forming the discharge path.

A hole may be formed in the second body 452b. The hole may include a first hole, a second hole, and a third hole. The first hole may be formed at one end of the second body 452b to penetrate in the z axis direction. The second hole may be connected in the center of the first hole and extend in the −y axis direction. The third hole may be connected to the second hole at the other end of the second body 452b and formed in the −z axis direction. The first hole of the second body 452b is connected to the hole of the first body 452a to form a discharge space.

The gas inlet 456a may be combined with one end of the second body 452b. The gas inlet 456a may have the same cross section as the second body 452b. The gas inlet is connected to the second body 452b to supply an initial discharge gas and a process gas.

A first waveguide 440a is disposed on the second body 452b. The second body 452b may be cooled by a refrigerant.

The first waveguide 440a may be a rectangular waveguide. The first waveguide 440a may be WR284. A first slit 449a may be formed at a contact surface between the first waveguide 440a and the second body 452b.

The first slit 449a may allow a microwave propagating along the first waveguide 440a to be radiated in a direction of the first dielectric window 447a.

The first slit 449a may have a rectangular or square shape. An elongated direction of the first waveguide 440a may be the x axis direction. At the cross section of the first waveguide 440a, a long-direction (y axis direction) surface may be in contact with the second body 452b. One end surface of the first waveguide 440a may receive a microwave from a microwave generator, and the other end surface thereof may be blocked with a conductor plate 442.

The first dielectric window 447a may have a plate shape. Sealing means such as an O-ring may be disposed between the first dielectric window 447a and the second body 452b.

The third body 452c may have the same structure as the first body 452a. The third body 452c may have the shape of a rectangular pillar aligned in the z axis direction. The third body 452c may include a hole penetrating in the z axis direction. The hole of the third body 452c is connected to the hole of the second body 352b.

A second magnetic core 454b may be wound around the third body 452c. The second magnetic core 454b may have the same structure as the first magnetic core 454a. The second magnetic core 454b may be a ferrite material or a nano-crystalline material. The second induction coil 459b is disposed to wind the second magnetic core 454b. The second induction coil 459b is connected to a second AC power supply. Alternating current (AC) flowing in the second induction coil 459b induces a magnetic flux to the second magnetic core 454b. The magnetic flux forms an induced electric field at the third body 452c, and the induced electric field generates inductively-coupled plasma in a discharge space. A direction of an induced electric field induced by the first AC power supply and a direction of an induced electric field induced by the second AC power supply may be opposite to each other.

The fourth body 452d may have the same structure as the second body 452b. A second slit 449b of the second waveguide 440b may be formed at a surface that is in contact with the fourth body 452d. The fourth body 452d includes a second dielectric window 447b. The second slit 449b radiates a microwave to transmit the microwave into the fourth body 452d through the second dielectric window 447b. The microwave generates microwave plasma. The fourth body 452d may be combined with the first body 452a through an insulating spacer 461.

The inner discharge spaces of the first to fourth bodies 452a-452d may each have rectangular cross sections. The first and third bodies 452a and 452c may be electrically floated, and the second and fourth bodies 452b and 452d may be electrically grounded.

Inductively-coupled plasma is mainly generated at the first and third bodies 452a and 452c, and microwave plasma is mainly generated at the second and fourth bodies 452b and 452d. Accordingly, there may be a distinction between an area where the inductively-coupled plasma is generated and an area where the microwave plasma is generated. The microwave plasma may be diffused to migrate to the area where the inductively-coupled plasma is generated.

According to a modified embodiment of the present invention, the first and third bodies 452a and 452c may each be cylindrical insulators. The insulator may be alumina, quartz or ceramic. Thus, the inner hole of the second body 452b may have a cylindrical shape at both ends of the z axis direction, and a hole of the y axis direction may have a square shape.

According to a modified embodiment of the present invention, a position of the gas inlet and a position of the gas outlet are interchangeable.

Figure 10:
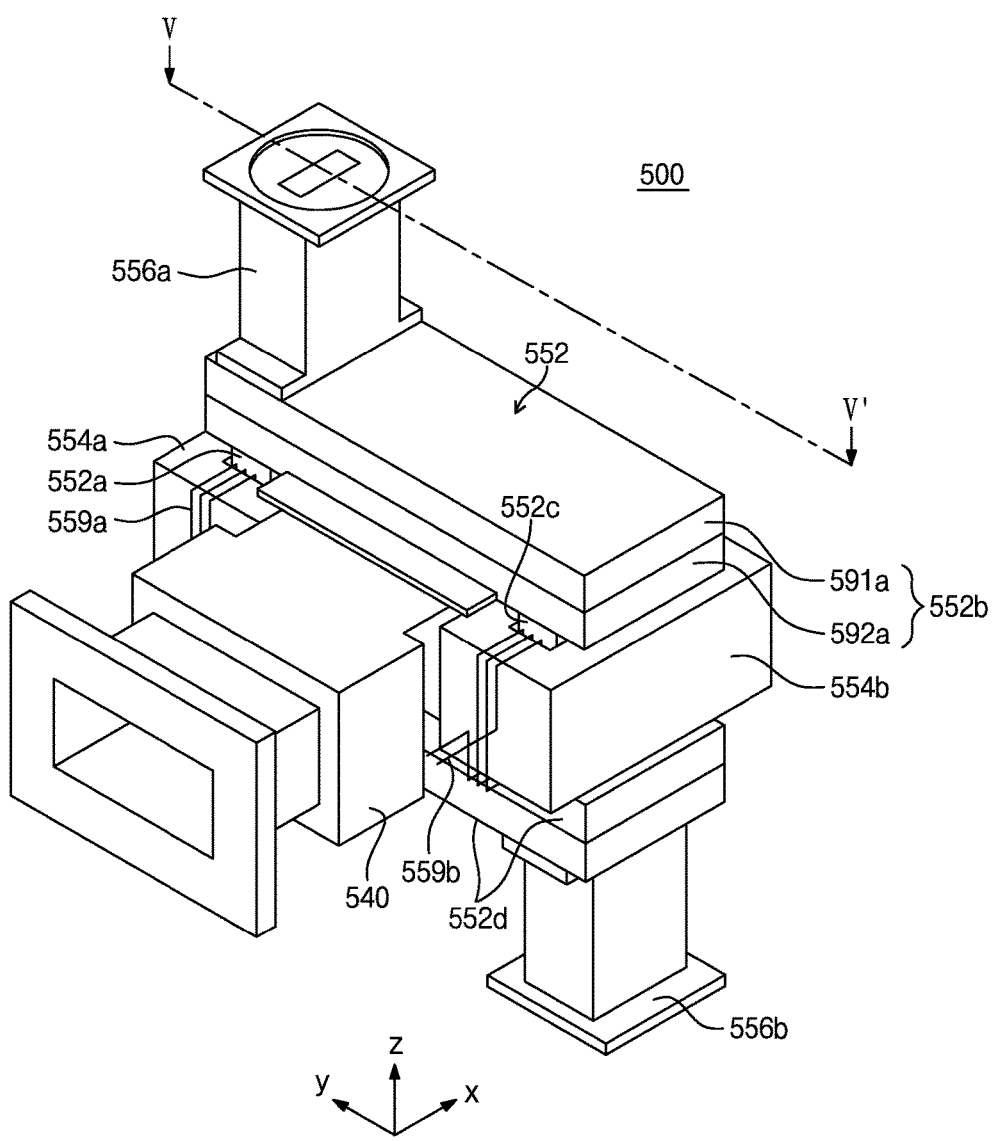
FIG. 10 is a perspective view of a plasma generation apparatus according to another embodiment of the present invention.

FIG. 10 is a perspective view of a plasma generation apparatus 500 according to another embodiment of the present invention.

Figure 11:
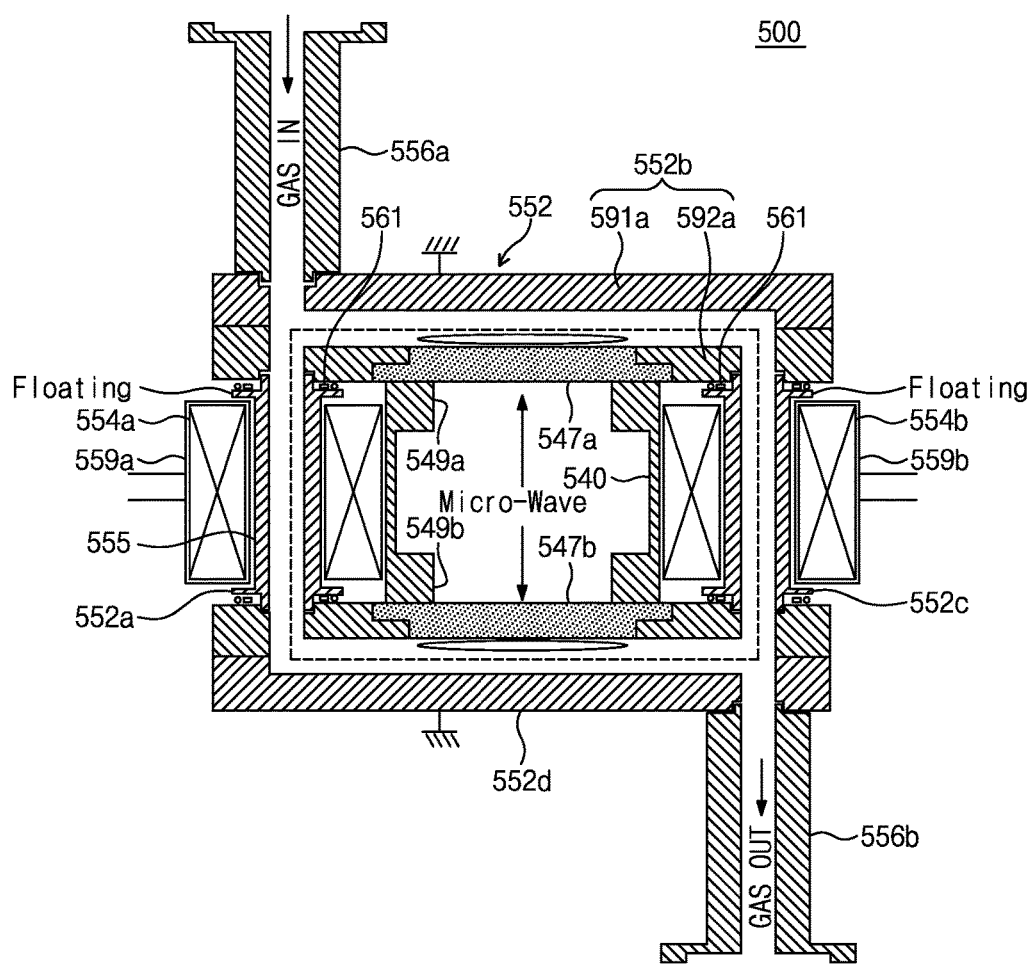
FIG. 11 is a cross-cross sectional view taken along the line V-V' in FIG. 10.

FIG. 11 is a cross-cross sectional view taken along the line V-V' in FIG. 10.

Referring to FIGS. 10 and 11, the plasma generation apparatus 500 includes magnetic cores 554a and 554b forming a closed loop, a chamber 552 disposed to penetrate the closed loop of the magnetic cores 554a and 554b and including at least one discharge space of a closed loop and dielectric windows 547a and 547b, induction coils 559a and 559b disposed to wind the magnetic cores 554a and 554b, and a waveguide 540 radiating a microwave through slits 549a and 549b and the dielectric windows 547a and 547b. Alternating current (AC) flowing in the induction coils 559a and 559b form a magnetic flux at the magnetic cores 554a and 554b, and the magnetic flux generates inductively-coupled plasma inside the chamber 552. A microwave propagating along the waveguide 540 generates microwave plasma inside the chamber 552.

The chamber 552 may be made of a conductive material. The conductive material may be aluminum. The chamber 552 may include first to fourth bodies 552a~552d. The first to fourth bodies 552a~552d may be sequentially connected to provide a toroidal discharge space. The first to fourth bodies 552a~552d may be electrically insulated from each other through an insulating spacer 561.

The first body 552a may have the shape of a rectangular pillar aligned in the z axis direction. A hole may be formed in the first body 552a. The hole of the first body 552 may be a hole penetrating in the z axis direction. The first body 552a may be cooled by a refrigerant.

A depression 555 is formed at an outer side surface of the first body 552a. A first magnetic core 554a is disposed at the depression 555. The first magnetic core 554a may be a ferrite or nano-crystalline core. A first induction coil 559a is disposed to wind the first magnetic core 554a. The first induction coil 559a is connected to a first AC power supply. The first induction coil 559a forms a first coil of a transformer, and inductively-coupled plasma generated at the chamber 552 forms a second coil of the transformer. Current flowing in the first induction coil 559a induces a magnetic flux to the first magnetic core 554a, and time varying magnetic flux causes an induced electric field to be formed inside the chamber 552. The induced electric field generates inductively-coupled plasma. The first body 552a may be electrically floated such that the chamber 552 does not play as the second coil of the transformer.

The second body 552b may be aligned in the y axis direction. The second body 552b may include a top late 591a and a bottom plate 592a. A hole may be formed in the second body 552b. The hole may include a first hole, a second hole, and a third hole. The first hole may be formed at one end of the second body 252b to penetrate in the z axis direction. The second hole may be connected in the center of the first hole and extend in the −y axis direction. The third hole may be connected the second hole at the other end of the second body 552b and formed in the −z axis direction. The first hole of the second body 552b is connected to the hole of the first body 552a to form a discharge space.

The gas inlet 556a may be combined with one end of the second body 552b. The gas inlet 556a may have the same cross section as the second body 552b. The gas inlet 556a is connected to the second body 552b to supply an initial discharge gas and a process gas.

A waveguide 540 is disposed between the second body 552b and the fourth body 552d. The second body 552b may be cooled by a refrigerant.

The waveguide 540 may be a rectangular waveguide. The waveguide 540 may be WR284. A first slit 549a may be formed at a contact surface between the waveguide 540 and the second body 552b, and a second slit 549b may be formed at a contact surface between the waveguide 540 and the fourth body 552d.

The first slit 549a may allow a microwave propagating along the waveguide 540 to be radiated in a direction of the first dielectric window 547a. The second slit 549b may allow the microwave propagating along the waveguide 540 to be radiated in a direction of the second dielectric window 547b.

The first slits 549a may have a rectangular or square shape. An elongated direction of the waveguide 540 may be the x axis direction. At the cross section of the waveguide 540, a long-direction (y axis direction) surface may be in contact with the second body 552b. One end surface of the waveguide 540 may receive a microwave from a microwave generator, and the other end surface thereof may be blocked with a conductor plate.

The first dielectric window 547a may have a plate shape. Sealing means such as an O-ring may be disposed between the first dielectric window 547a and the second body 552b.

The third body 552c may have the same structure as the first body 552a. The third body 552c may have the shape of a rectangular pillar aligned in the z axis direction. The third body 552c may include a hole penetrating in the z axis direction. The hole of the third body 552c is connected to the hole of the second body 552b.

A second magnetic core 554b may be wound around the third body 552c. The second magnetic core 554b may have the same structure as the first magnetic core 554a. The second magnetic core 554b may be a ferrite material or a nano-crystalline material. The second induction coil 559b is disposed to wind the second magnetic core 554b. The second induction coil 559b is connected to a second AC power supply. Alternating current (AC) flowing in the second induction coil 559b induces a magnetic flux to the second magnetic core 554b. The magnetic flux forms an induced electric field at the third body 552c, and the induced electric field generates inductively-coupled plasma in a discharge space. A direction of an induced electric field induced by the first AC power supply and a direction of an induced electric field induced by the second AC power supply may be opposite to each other.

The fourth body 552d may have the same structure as the second body 552b. A second slit 549b of the waveguide 540 may be formed at a surface that is in contact with the fourth body 552d. The fourth body 552d includes a second dielectric window 547b. The second slit 549b radiates a microwave to transmit the microwave into the fourth body 552d through the second dielectric window 547b. The microwave generates microwave plasma. The fourth body 552d may be combined with the first body 552a through an insulating spacer 561.

The inner discharge spaces of the first to fourth bodies 552a~552d may each have rectangular cross sections. The first and third bodies 552a and 552c may be electrically floated, and the second and fourth bodies 552b and 552d may be electrically grounded.

Inductively-coupled plasma is mainly generated at the first and third bodies 552a and 552c, and microwave plasma is mainly generated at the second and fourth bodies 552b and 552d. Accordingly, there may be a distinction between an area where the inductively-coupled plasma is generated and an area where the microwave plasma is generated. The microwave plasma may be diffused to migrate to the area where the inductively-coupled plasma is generated.

Figure 12:
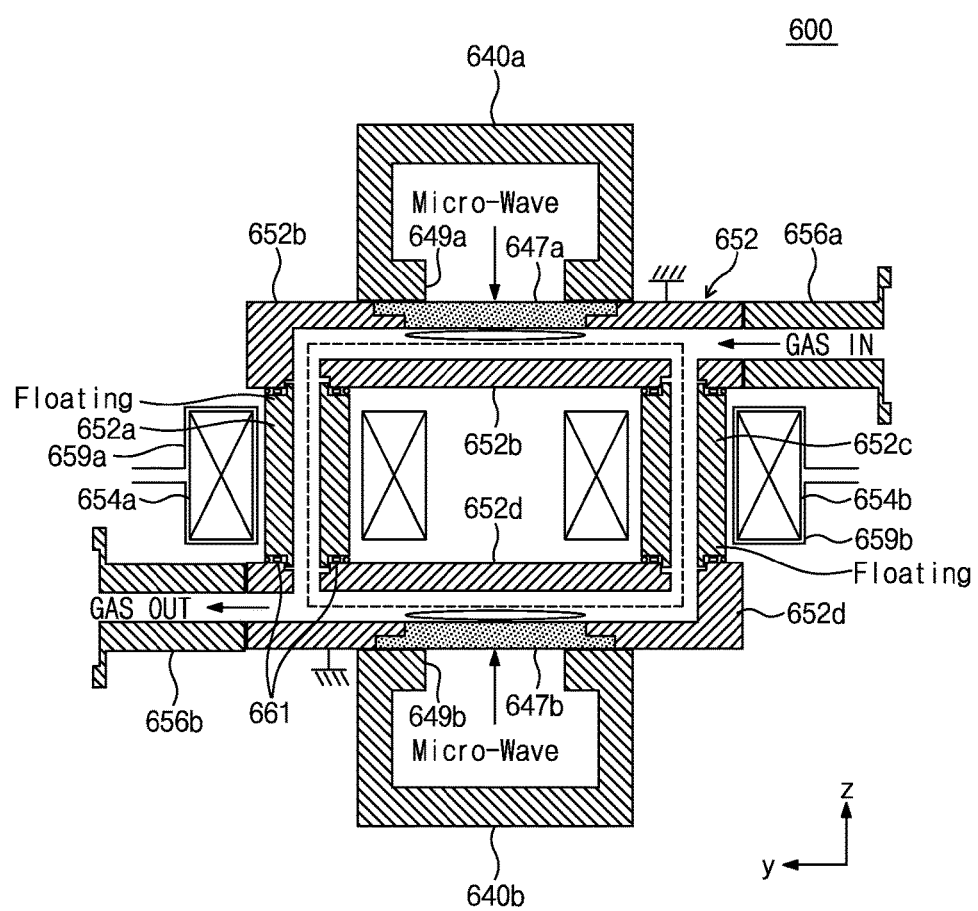
FIG. 12 is a cross-cross sectional view of a plasma generation apparatus according to another embodiment of the present invention.

FIG. 12 is a cross-cross sectional view of a plasma generation apparatus 600 according to another embodiment of the present invention.

Referring to FIG. 12, the plasma generation apparatus 600 includes magnetic cores 654a and 654b forming a closed loop, a chamber 652 disposed to penetrate the closed loop of the magnetic cores 654a and 654b and including at least one discharge space of a closed loop and dielectric windows 647a and 647b, induction coils 659a and 659b disposed to wind the magnetic cores 654a and 654b, and waveguides 640a and 640b radiating a microwave through slits 649a and 649b and the dielectric windows 647a and 647b. Alternating current (AC) flowing in the induction coils 659a and 659b form a magnetic flux at the magnetic cores 654a and 654b, and the magnetic flux generates inductively-coupled plasma inside the chamber 652. A microwave propagating along the waveguides 640a and 640b generates microwave plasma inside the chamber 652.

The chamber 652 may be made of a conductive material. The conductive material may be aluminum. The chamber 652 may include first to fourth bodies 652a~652d. The first to fourth bodies 652a~652d may be sequentially connected to provide a toroidal discharge space. The first to fourth bodies 652a~652d may be electrically insulated from each other through an insulating spacer 661.

The first body 652a may have the shape of a rectangular pillar aligned in the z axis direction. A hole is formed in the first body 652a. The hole of the first body 652a may be a hole penetrating in the z axis direction. The first body 652a may be cooled by a refrigerant.

A first magnetic core 654a is disposed in the circumference of the first body 652a. The first magnetic core 654a may be a ferrite or nano-crystalline core. A first induction coil 659a is disposed to wind the first magnetic core 654a. The first induction coil 659a is connected to a first AC power supply. The first induction coil 659a forms a first coil of a transformer, and inductively-coupled plasma generated at the chamber 652 forms a second coil of the transformer. Current flowing in the first induction coil 659a induces a magnetic flux to the first magnetic core 654a, and time varying magnetic flux causes an induced electric field to be formed inside the chamber 652. The induced electric field generates inductively-coupled plasma. The first body 652a may be electrically floated such that the chamber 652 does not play as the second coil of the transformer.

The second body 652b may be aligned in the y axis direction. The second body 652b may have a rectangular shape with a hole formed therein. The hole may include a first hole, a second hole, and a third hole. The first hole may be formed at one end of the second body 652b in the z axis direction. The second hole may be connected to the first hole and extend in the −y axis direction. The third hole may be connected to the second hole to be formed in the −z axis direction. The first hole of the second body 652b is connected to the hole of the first body 652a to form a discharge space.

The gas inlet 656a may be combined with the other end of the second body 652b. The gas inlet 656a may have the same cross section as the second body 652b. The gas inlet 656a is connected to the second body 652b to supply an initial discharge gas and a process gas.

A first waveguide 640a is disposed on the second body 652b. The second body 652b may be cooled by a refrigerant.

The first waveguide 640a may be a rectangular waveguide. The first waveguide 640a may be WR284. A first slit 649a may be formed at a contact surface between the first waveguide 640a and the second body 652b.

The first slit 649a may allow a microwave propagating along the first waveguide 640a to be radiated in a direction of the first dielectric window 647a.

The first slit 649a may have a rectangular or square shape. An elongated direction of the first waveguide 640a may be the x axis direction. At the cross section of the first waveguide 640a, a long-direction (y axis direction) surface may be in contact with the second body 652b. One end surface of the first waveguide 640a may receive a microwave from a microwave generator, and the other end surface thereof may be blocked with a conductor plate.

The first dielectric window 647a may have a plate shape. Sealing means such as an O-ring may be disposed between the first dielectric window 647a and the second body 652b.

The third body 652c may have the same structure as the first body 652a. The third body 652c may have the shape of a rectangular pillar aligned in the z axis direction. The third body 652c may include a hole penetrating in the z axis direction. The hole of the third body 652c is connected to the hole of the second body 652b.

A second magnetic core 654b may be wound around the third body 652c. The second magnetic core 654b may have the same structure as the first magnetic core 654a. The second magnetic core 654b may be a ferrite material or a nano-crystalline material. The second induction coil 659b is disposed to wind the second magnetic core 654b. The second induction coil 659b is connected to a second AC power supply. Alternating current (AC) flowing in the second induction coil 659b induces a magnetic flux to the second magnetic core 654b. The magnetic flux forms an induced electric field at the third body 652c, and the induced electric field generates inductively-coupled plasma in a discharge space. A direction of an induced electric field induced by the first AC power supply and a direction of an induced electric field induced by the second AC power supply may be opposite to each other.

The fourth body 652d may have the same structure as the second body 652b. A second slit 649b of the second waveguide 640b may be disposed at a surface that is in contact with the fourth body 652d. The fourth body 652d includes a second dielectric window 647b. The second slit 649b radiates a microwave to transmit the microwave into the fourth body 652d through the second dielectric window 647b. The microwave generates microwave plasma. The fourth body 652d may be combined with the first body 652a through an insulating spacer 661.

The gas outlet 656b may be combined with the fourth body 652d. The gas outlet 656b may have the same cross section as the fourth body 652d. The gas outlet 656b may be connected to the fourth body 652d to discharge a dissociated gas.

The inner discharge spaces of the first to fourth bodies 652a-652d may each have rectangular cross sections. The first and third bodies 652a and 652c may be electrically floated, and the second and fourth bodies 652b and 652d may be electrically grounded.

Inductively-coupled plasma is mainly generated at the first and third bodies 652a and 652c, and microwave plasma is mainly generated at the second and fourth bodies 652b and 652d. Accordingly, there may be a distinction between an area where the inductively-coupled plasma is generated and an area where the microwave plasma is generated. The microwave plasma may be diffused to migrate to the area where the inductively-coupled plasma generated.

Figure 13:
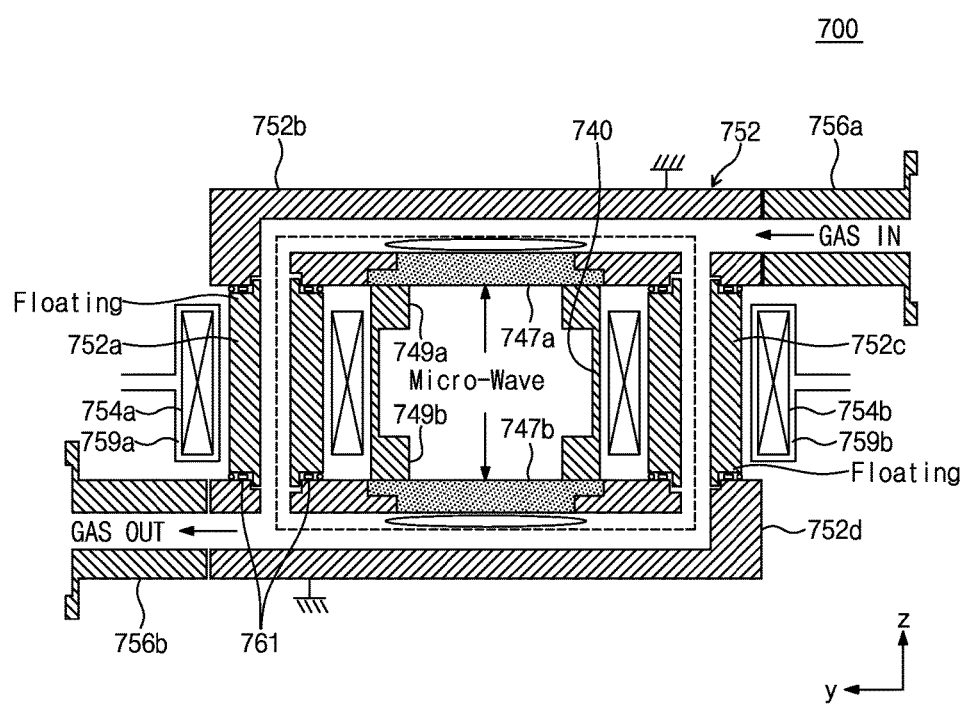
FIG. 13 is a cross-cross sectional view of a plasma generation apparatus according to another embodiment of the present invention.

FIG. 13 is a cross-cross sectional view of a plasma generation apparatus 700 according to another embodiment of the present invention.

Referring to FIG. 13, the plasma generation apparatus 700 includes magnetic cores 754a and 754b forming a closed loop, a chamber 752 disposed to penetrate the closed loop of the magnetic cores 754a and 754b and including at least one discharge space of a closed loop and dielectric windows 747a and 747b, induction coils 759a and 759b disposed to wind the magnetic cores 754a and 754b, and a waveguide 744 radiating a microwave through slits 749a and 749b and the dielectric windows 747a and 747b. Alternating current (AC) flowing in the induction coils 759a and 759b form a magnetic flux at the magnetic cores 754a and 754b, and the magnetic flux generates inductively-coupled plasma inside the chamber 752. A microwave propagating along the waveguide 740 generates microwave plasma inside the chamber 752.

The chamber 752 may be made of a conductive material. The conductive material may be aluminum. The chamber 752 may include first to fourth bodies 752a~752d. The first to fourth bodies 752a~752d may be sequentially connected to provide a toroidal discharge space. The first to fourth bodies 752a~752d may be electrically insulated from each other through an insulating spacer 761.

The first body 752a may have the shape of a rectangular pillar aligned in the z axis direction. A hole may be formed in the first body 752a. The hole of the first body 752a may be a hole penetrating in the z axis direction. The first body 752a may be cooled by a refrigerant.

A first magnetic core 754a is disposed to cover an outer side surface of the first body 752a. The first magnetic core 754a may be a ferrite or nano-crystalline core. A first induction coil 759a is disposed to wind the first magnetic core 754a. The first induction coil 759a is connected to a first AC power supply. The first induction coil 759a forms a first coil of a transformer, and inductively-coupled plasma generated at the chamber 752 forms a second coil of the transformer. Current flowing in the first induction coil 759a induces a magnetic flux to the first magnetic core 754a, and time varying magnetic flux causes an induced electric field to be formed inside the chamber 752. The induced electric field generates inductively-coupled plasma. The first body 752a may be electrically floated such that the chamber 752 does not play as the second coil of the transformer.

The second body 752b may be aligned in the y axis direction. A hole is formed in the second body 752b. The hole may include a first hole, a second hole, and a third hole. The first hole may be formed at one end of the second body 752b in the z axis direction. The second hole may be connected to the first hole and extend in the −y axis direction. The third hole may be connected to the second hole at the other end of the second body 752b to be formed in the −z axis direction. The hole of the second body 752b is connected to the hole of the first body 752a to form a discharge space.

The gas inlet 756a may be combined with the other end of the second body 752b. The gas inlet 756a may have the same cross section as the second body 752b. The gas inlet 756a is connected to the second body 752b to supply an initial discharge gas and a process gas.

A waveguide 740 is disposed between the second body 752b and the fourth body 752d. The second body 752b may be cooled by a refrigerant.

The waveguide 740 may be a rectangular waveguide. The waveguide 740 may be WR284. A first slit 749a may be formed at a contact surface between the waveguide 740 and the second body 752b, and a second slit 749b may be formed at a contact surface between the waveguide 740 and the fourth body 752d.

The first slit 749a may allow a microwave propagating along the waveguide 740 to be radiated in a direction of the first dielectric window 747a. The second slit 479b may allow the microwave propagating along the waveguide 740 to be radiated in a direction of the second dielectric window 747b.

The first slits 749a may have a rectangular or square shape. An elongated direction of the waveguide 740 may be the x axis direction. At the cross section of the waveguide 740, a long-direction (y axis direction) surface may be in contact with the second body 752b. One end surface of the waveguide 740 may receive a microwave from a microwave generator, and the other end surface thereof may be blocked with a conductor plate.

The first dielectric window 747a may have a plate shape. Sealing means such as an O-ring may be disposed between the first dielectric window 747a and the second body 752b.

The third body 752c may have the same structure as the first body 752a. The third body 752c may have the shape of a rectangular pillar aligned in the z axis direction. The third body 752c may include a hole penetrating in the z axis direction. The hole of the third body 752c is connected to the hole of the second body 752b.

A second magnetic core 754b may be wound around the third body 752c. The second magnetic core 754b may have the same structure as the first magnetic core 754a. The second magnetic core 754b may be a ferrite material or a nano-crystalline material. The second induction coil 759b is disposed to wind the second magnetic core 754b. The second induction coil 759b is connected to a second AC power supply. Alternating current (AC) flowing in the second induction coil 759b induces a magnetic flux to the second magnetic core 754b. The magnetic flux forms an induced electric field at the third body 752c, and the induced electric field generates inductively-coupled plasma in a discharge space. A direction of an induced electric field induced by the first AC power supply and a direction of an induced electric field induced by the second AC power supply may be opposite to each other.

The fourth body 752d may have the same structure as the second body 752b. A second slit 749b of the second waveguide 740b may be disposed at a surface that is in contact with the fourth body 752d. The fourth body 752d includes a second dielectric window 747b. The second slit 749b radiates a microwave to transmit the microwave into the fourth body 752d through the second dielectric window 747b. The microwave generates microwave plasma. The fourth body 752d may be combined with the first body 752a through an insulating spacer 761.

The gas outlet 756b may be combined with the fourth body 752d. The gas outlet 756b may have the same cross section as the fourth body 752d. The gas outlet 756b may be connected to the fourth body 752d to discharge a dissociated gas.

The inner discharge spaces of the first to fourth bodies 752a~752d may each have rectangular cross sections. The first and third bodies 752a and 752c may be electrically floated, and the second and fourth bodies 752b and 752d may be electrically grounded.

Inductively-coupled plasma is mainly generated at the first and third bodies 752a and 752c, and microwave plasma is mainly generated at the second and fourth bodies 752b and 752d. Accordingly, there may be a distinction between an area where the inductively-coupled plasma is generated and an area where the microwave plasma is generated. The microwave plasma may be diffused to migrate to the area where the inductively-coupled plasma generated.

Figure 14:
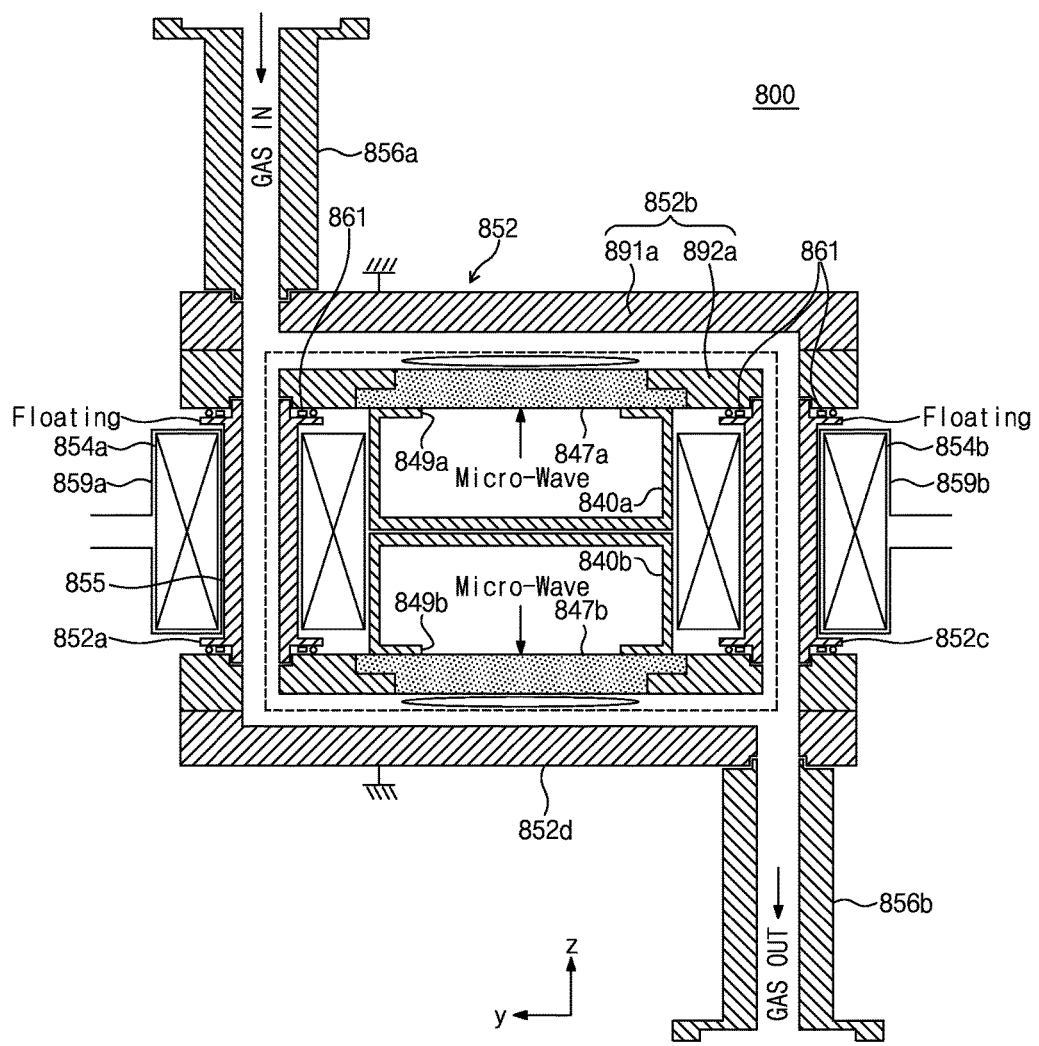
FIG. 14 is a cross-cross sectional view of a plasma generation apparatus according to another embodiment of the present invention.

FIG. 14 is a cross-cross sectional view of a plasma generation apparatus 800 according to another embodiment of the present invention.

Referring to FIG. 14, the plasma generation apparatus 800 includes magnetic cores 854a and 854b forming a closed loop, a chamber 852 disposed to penetrate the closed loop of the magnetic cores 854a and 854b and including at least one discharge space of a closed loop and dielectric windows 847a and 847b, induction coils 859a and 859b disposed to wind the magnetic cores 854a and 854b, and waveguides

840a and 840b radiating a microwave through slits 849a and 849b and the dielectric windows 847a and 847b.

Alternating current (AC) flowing in the induction coils 859a and 859b form a magnetic flux at the magnetic cores 854a and 854b, and the magnetic flux generates inductively-coupled plasma inside the chamber 852. A microwave propagating along the waveguides 840a and 840b generates microwave plasma inside the chamber 852.

The chamber 852 may be made of a conductive material. The conductive material may be aluminum. The chamber 852 may include first to fourth bodies 852a~852d. The first to fourth bodies 852a~852d may be sequentially connected to provide a toroidal discharge space. The first to fourth bodies 852a~852d may be electrically insulated from each other through an insulating spacer 861.

The first body 852a may have the shape of a rectangular pillar aligned in the z axis direction. A hole is formed in the first body 852a. The hole of the first body 852a may be a hole penetrating in the z axis direction. The first body 852a may be cooled by a refrigerant.

A depression 855 is formed at an outer side surface of the first body 852a. A first magnetic core 854a is disposed at the depression 855 of the first body 852a. The first magnetic core 854a may be a ferrite or nano-crystalline core. A first induction coil 859a is disposed to wind the first magnetic core 854a. The first induction coil 859a is connected to a first AC power supply. The first induction coil 859a forms a first coil of a transformer, and inductively-coupled plasma generated at the chamber 852 forms a second coil of the transformer. Current flowing in the first induction coil 859a induces a magnetic flux to the first magnetic core 854a, and time varying magnetic flux causes an induced electric field to be formed inside the chamber 852. The induced electric field generates inductively-coupled plasma. The first body 852a may be electrically floated such that the chamber 852 does not play as the second coil of the transformer.

The second body 852b may be aligned in the y axis direction. The second body 852b includes a top plate 891a and a bottom plate 892a. A hole is formed in the second body 852a. The hole may include a first hole, a second hole, and a third hole. The first hole may be formed at one end of the second body 852b in the z axis direction. The second hole may be connected to the first hole and extend in the −y axis direction. The third hole may be connected to the second hole to be formed in the −z axis direction. The hole of the second body 852b is connected to the hole of the first body 852a to form a discharge space.

The gas inlet 856a may be combined with one end of the second body 852b. The gas inlet 856a may have the same cross section as the second body 852b. The gas inlet 856a is connected to the second body 852b to supply an initial discharge gas and a process gas.

The waveguides 840a and 840b are disposed between the second body 852b and the fourth body 852d. The second body 852b may be cooled by a refrigerant.

The waveguides 840a and 840b may be rectangular waveguides, respectively. Each of the waveguides 840a and 840b may be WR284. The waveguides 840a and 840b may include a first waveguide 840a and a second waveguide 840b. In an inner space formed by the chamber 852, the first waveguide 840a and the second waveguide 840b may be disposed adjacent to each other. The first waveguide 840a may be connected to a first microwave generator, and the second waveguide 840b may be connected to a second microwave generator.

A first slit 849a may be formed at a contact surface between the first waveguide 840a and the second body 852b, and a second slit 849b may be formed at a contact surface between the second waveguide 840b and the fourth body 852d.

The first slit 849a may allow a microwave propagating along the waveguide 840 to be radiated in a direction of the first dielectric window 847a. The second slit 479b may allow the microwave propagating along the waveguide 840 to be radiated in a direction of the second dielectric window 847b.

The first slits 849a may have a rectangular or square shape. An elongated direction of the waveguides 840a and 840b may be the x axis direction. At the cross section of the first waveguide 840a, a long-direction (y axis direction) surface may be in contact with the second body 852b. One end surface of the waveguide 840 may receive a microwave from a microwave generator, and the other end surface thereof may be blocked with a conductor plate.

Both the first waveguide 840a and the second waveguide 840b may not be inserted into the inner space formed by the chamber 852. In this case, the first waveguide 840a and the second waveguide 840b may include an area tapered in the minor axis direction (z axis direction).

The first dielectric window 847a may have a plate shape. Sealing means such as an O-ring may be disposed between the first dielectric window 847a and the second body 852b.

The third body 852c may have the same structure as the first body 852a. The third body 852c may have the shape of a rectangular pillar aligned in the z axis direction. The third body 852c may include a hole penetrating in the z axis direction. The hole of the third body 852c is connected to the hole of the second body 852b.

A second magnetic core 854b may be wound around the third body 852c. The second magnetic core 854b may have the same structure as the first magnetic core 854a. The second magnetic core 854b may be a ferrite material or a nano-crystalline material. The second induction coil 859b is disposed to wind the second magnetic core 854b. The second induction coil 859b is connected to a second AC power supply. Alternating current (AC) flowing in the second induction coil 859b induces a magnetic flux to the second magnetic core 854b. The magnetic flux forms an induced electric field at the third body 852c, and the induced electric field generates inductively-coupled plasma in a discharge space. A direction of an induced electric field induced by the first AC power supply and a direction of an induced electric field induced by the second AC power supply may be opposite to each other.

The fourth body 852d may have the same structure as the second body 852b. A second slit 849b of the waveguide 840 may be disposed at a surface that is in contact with the fourth body 852d. The fourth body 852d includes a second dielectric window 847b. The second slit 849b radiates a microwave to transmit the microwave into the fourth body 852d through the second dielectric window 847b. The microwave generates microwave plasma. The fourth body 852d may be combined with the first body 852a through an insulating spacer 861.

The inner discharge spaces of the first to fourth bodies 852a~852d may each have rectangular cross sections. The first and third bodies 852a and 852c may be electrically floated, and the second and fourth bodies 852b and 852d may be electrically grounded.

Inductively-coupled plasma is mainly generated at the first and third bodies 852a and 852c, and microwave plasma is mainly generated at the second and fourth bodies 852b and 852d. Accordingly, there may be a distinction between an area where the inductively-coupled plasma is generated and an area where the microwave plasma is generated. The microwave plasma may be diffused to migrate to the area where the inductively-coupled plasma generated.

As described so far, a remote plasma generation apparatus according to an embodiment of the present invention combines microwave plasma and inductively-coupled plasma to improve ease in initial discharge and discharge stability and process a high rate of flow.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. A plasma generation apparatus comprising:
   a chamber including a dielectric window and a toroidal discharge space without a substrate;
   a magnetic core disposed to surround a portion of the chamber;
   an induction coil disposed to wind around the magnetic core; and
   a waveguide radiating a microwave through the dielectric window,
   wherein alternating current flowing in the induction coil forms a magnetic flux at the magnetic core, and the magnetic flux generates inductively-coupled plasma in the toroidal discharge space,
   wherein the radiated microwave is configured to generate initial microwave plasma for ignition inside the chamber without an external static magnetic field, wherein the chamber includes first to fourth bodies,
   wherein the first to fourth bodies are sequentially connected to provide the toroidal discharge space,
   wherein the magnetic core includes a first magnetic core and a second magnetic core,
   wherein the first magnetic core is disposed to surround the first body, wherein the second magnetic core is disposed to surround the third body,
   wherein the waveguide includes a first waveguide with a first slit and a second waveguide with a second slit,
   wherein the first waveguide and the second waveguide are rectangular waveguides,
   wherein the first slit is formed on a side wall of the first waveguide, wherein the second slit is formed on a side wall of the second waveguide, wherein the dielectric window includes a first dielectric window and a second dielectric window,
   wherein the first dielectric window is mounted on the second body, and the second dielectric window is mounted on the fourth body,
   wherein the first slit provides radiates a microwave to the second body through the first dielectric window, and
   wherein the second slit provides radiates a microwave to the fourth body through the second dielectric window.

2. The plasma generation apparatus of claim 1, wherein the chamber is made of a conductor and includes an insulating spacer blocking induced current.

3. The plasma generation apparatus of claim 1, wherein the first body and the third body are electrically floated.

4. The plasma generation apparatus of claim 1, wherein the chamber further includes:
   a gas inlet adapted to supply an initial discharge gas and a process gas; and
   a gas outlet adapted to vent a dissociated gas,
   wherein the gas inlet is mounted on the first body, and
   wherein the gas outlet is mounted on the third body.

5. The plasma generation apparatus of claim 1, wherein the chamber further includes:
   a gas inlet adapted to supply an initial discharge gas and a process gas; and a gas outlet adapted to discharge a dissociated gas, wherein the gas inlet is mounted on the second body, and wherein the gas outlet is mounted on the fourth body.

6. The plasma generation apparatus of claim 1, wherein the first body and the third body further include depressions, respectively,
   wherein the first magnetic core is combined with the depression of the first body, and
   wherein the second magnetic core is combined with the depression of the third body.

7. The plasma generation apparatus of claim 1, wherein the second body or the fourth body includes a top plate and a bottom plate,
   wherein a trench is formed at one surface of the top plate,
   wherein a trench is formed at one surface of the bottom plate, and
   wherein the trench of the top plate and the trench of the bottom plate are combined to form the toroidal discharge space.

8. The plasma generation apparatus of claim 1, wherein the induction coil includes:
   a first induction coil disposed to wind the first magnetic core; and
   a second induction coil disposed to wind the second magnetic core,
   wherein the first induction coil is connected to a first alternating current power supply, and
   wherein the second induction coil is connected to a second alternating current power supply.

9. The plasma generation apparatus of claim 1, further comprising:
   a cooling block disposed between the waveguide and the dielectric window.

10. The plasma generation apparatus of claim 1, further comprising at least one of:
    a microwave generator configured to provide a microwave to the waveguide;
    a tuner for impedance matching disposed between the microwave generator and the waveguide;
    a directional coupler disposed between the microwave generator and the waveguide to extract some of a reflection wave or a propagation wave;
    an isolator;
    a dummy load consuming a reflection wave; and
    a circulator configured to provide a propagation wave of the microwave generator to the waveguide and provide a reflection wave reflected from a load to the dummy load.

11. The plasma generation apparatus of claim 1, wherein the chamber has a square-shaped internal cross section.

12. The plasma generation apparatus of claim 1, wherein the magnetic core is a ferrite or nano-crystalline core.

13. The plasma generation apparatus of claim 1, wherein the dielectric window has a plate shape, and wherein the dielectric window includes at least one of quartz, alumina, ceramic, sapphire, aluminum nitride, and a combination thereof.

14. The plasma generation apparatus of claim 1, wherein each of the first and third bodies is an insulator, and each of the second and fourth bodies is a conductor.

15. The plasma generation apparatus of claim 1, wherein the first to fourth bodies are electrically insulated by an insulating spacer.

* * * * *